(12) United States Patent
Uchida et al.

(10) Patent No.: US 9,093,648 B2
(45) Date of Patent: Jul. 28, 2015

(54) ORGANIC EL ELEMENT, METHOD FOR MANUFACTURING THE SAME, AND ORGANIC EL DISPLAY DEVICE

(75) Inventors: Hideki Uchida, Osaka (JP); Tokiyoshi Umeda, Osaka (JP); Tohru Sonoda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 677 days.

(21) Appl. No.: 13/380,608

(22) PCT Filed: Jun. 3, 2010

(86) PCT No.: PCT/JP2010/003710
§ 371 (c)(1), (2), (4) Date: Dec. 23, 2011

(87) PCT Pub. No.: WO2011/001598
PCT Pub. Date: Jan. 6, 2011

(65) Prior Publication Data
US 2012/0091482 A1    Apr. 19, 2012

(30) Foreign Application Priority Data
Jul. 2, 2009    (JP) .................... 2009-157449

(51) Int. Cl.
*H01L 29/18*    (2006.01)
*H01L 51/00*    (2006.01)
(Continued)

(52) U.S. Cl.
CPC .......... *H01L 51/0013* (2013.01); *C23C 14/048* (2013.01); *H01L 27/3246* (2013.01); *H01L 27/3211* (2013.01); *H01L 2251/558* (2013.01)

(58) Field of Classification Search
CPC ............ H01L 51/0013; H01L 27/3246; H01L 27/3211; H01L 2251/558
USPC ............... 257/88, 40, 99, E27.119, E51.001, 257/E51.018; 445/35; 438/22
See application file for complete search history.

(56) References Cited

U.S. PATENT DOCUMENTS

| | | | | |
|---|---|---|---|---|
| 6,695,030 | B1 * | 2/2004 | Phillips et al. | 156/540 |
| 2004/0028942 | A1 * | 2/2004 | Culver et al. | 428/690 |
| 2006/0243377 | A1 * | 11/2006 | Matsuo et al. | 156/235 |

FOREIGN PATENT DOCUMENTS

| | | |
|---|---|---|
| EP | 0982974 A1 | 3/2000 |
| JP | 2000-106278 A | 4/2000 |

(Continued)

OTHER PUBLICATIONS

International Search Report received for PCT Patent Application No. PCT/JP2010/003710, mailed on Sep. 7, 2010, 5 pages (2 pages of English Translation and 3 pages Of PCT Search Report).

(Continued)

*Primary Examiner* — Vongsavanh Sengdara
(74) *Attorney, Agent, or Firm* — Morrison & Foerster LLP

(57) ABSTRACT

An anode 2 is formed on an element substrate 1. By using a film-forming solution containing a stacking material that forms an organic layer 43, a film is formed on a donor substrate 10 to pattern a transfer layer 11, thereby fabricating a transfer substrate 12. The transfer substrate 12 and the element substrate 1 are placed so as to face each other with spacers 13 interposed therebetween, such that the surface of the transfer substrate 12, which has the transfer layer 11 formed thereon, faces the element substrate 1 having the anode 2 formed thereon. The transfer substrate 12 and the element substrate 1 facing each other are held under vacuum conditions. The transfer substrate 12 is heated by a heat source 15 under the vacuum conditions to transfer the transfer layer 11 to the element substrate 1.

44 Claims, 29 Drawing Sheets

(51) Int. Cl.
*C23C 14/04* (2006.01)
*H01L 27/32* (2006.01)

(56) References Cited

FOREIGN PATENT DOCUMENTS

| JP | 2002-75638 A | 3/2002 |
|---|---|---|
| JP | 2003-77657 A | 3/2003 |
| JP | 2003-100454 A | 4/2003 |
| JP | 2003-264076 A | 9/2003 |
| JP | 2004-71551 A | 3/2004 |
| JP | 2004-79540 A | 3/2004 |
| JP | 2004-87143 A | 3/2004 |
| JP | 2006-309994 A | 11/2006 |
| JP | 2006-344459 A | 12/2006 |
| JP | 2008-235011 A | 10/2008 |

OTHER PUBLICATIONS

Boroson et al., "16.5L: Late-News Paper: Non-Contact OLED Color Patterning by Radiation-Induced Sublimation Transfer (RIST)", SID 05 Digest, 2005, pp. 972-975.

Hirano et al., "53.2: Distinguished Paper: Novel Laser Transfer Technology for Manufacturing Large-Sized OLED Displays", SID 07 Digest, 2007, pp. 1592-1595.

Lee et al., "21.3: A New Patterning Method for Full-Color Polymer Light-Emitting Devices: Laser Induced Thermal Imaging (LITI)", SID 02 Digest, 2002, pp .784-787.

\* cited by examiner (b)

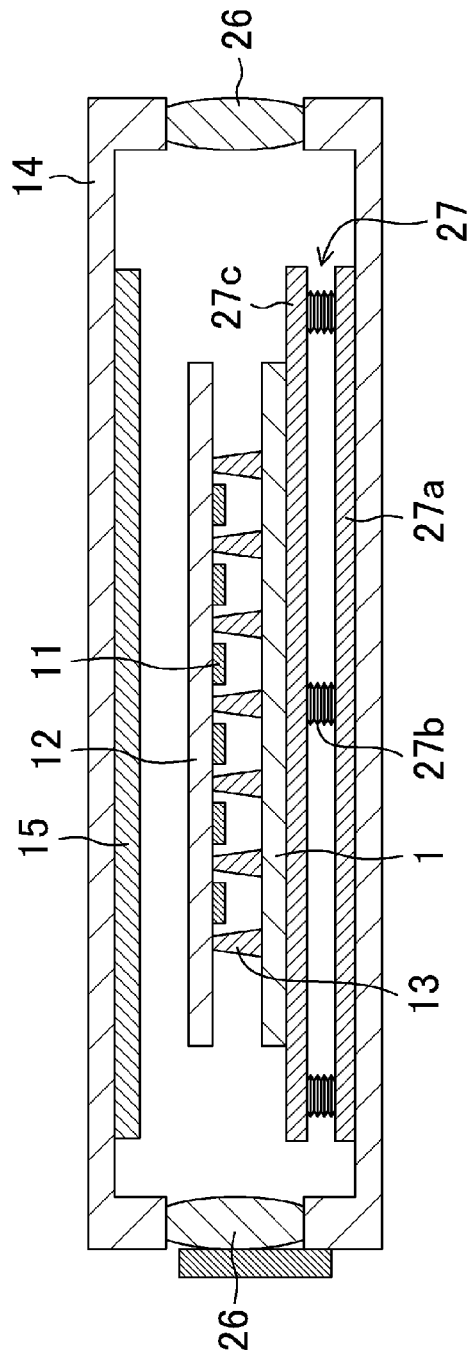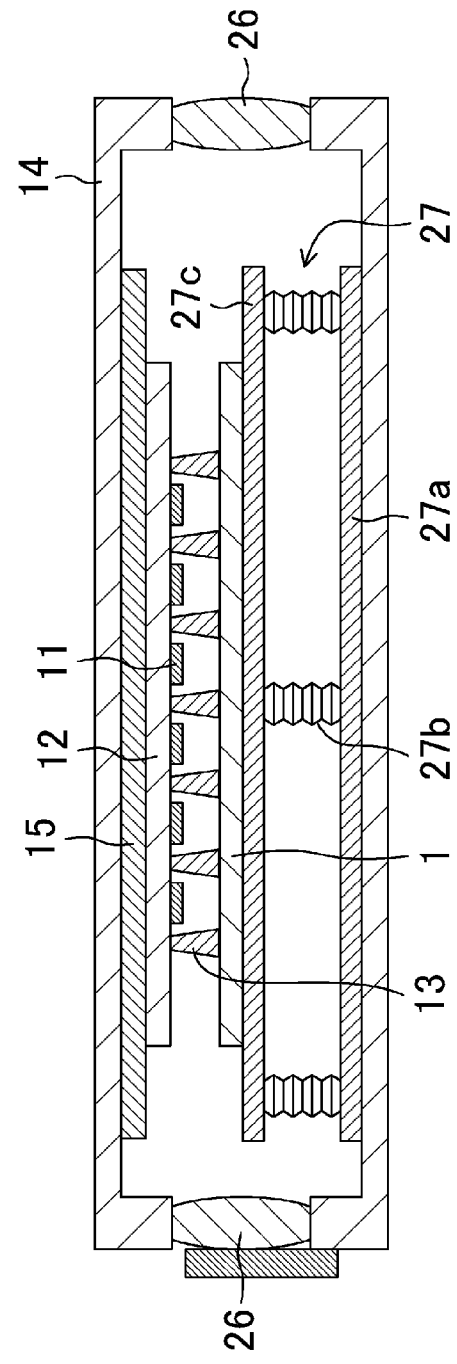

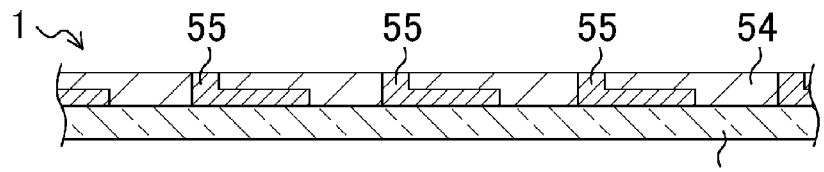
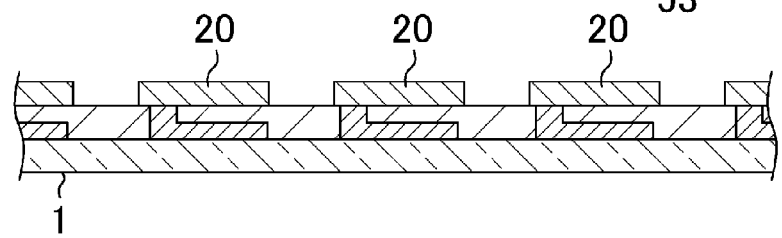
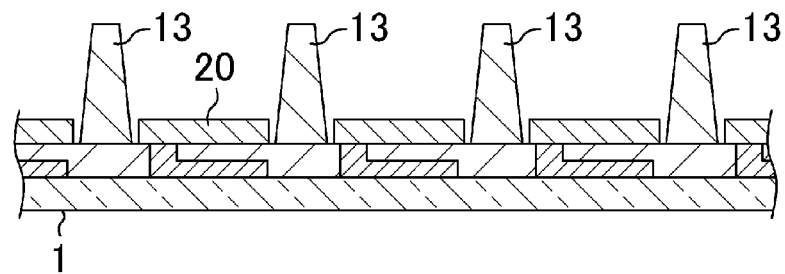
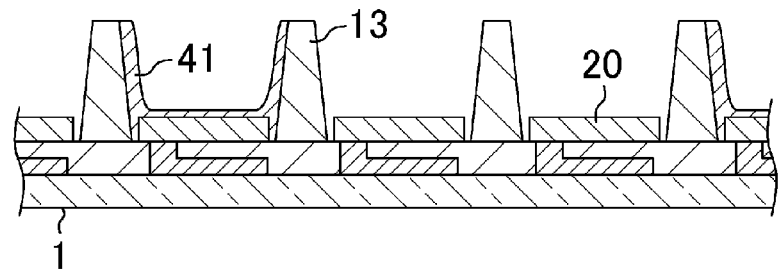
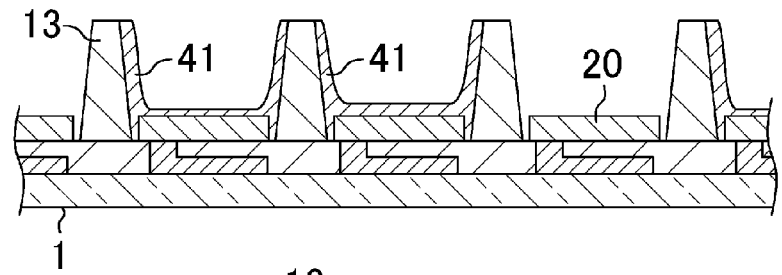
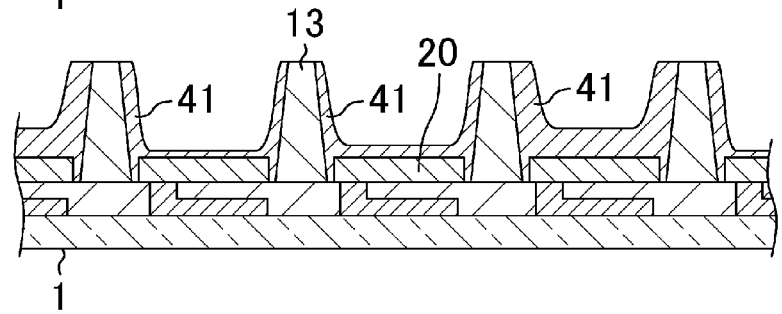

ORGANIC EL ELEMENT, METHOD FOR MANUFACTURING THE SAME, AND ORGANIC EL DISPLAY DEVICE

CROSS REFERENCE TO RELATED APPLICATIONS

This is a U.S. National Phase patent application of PCT/JP2010/003710, filed Jun. 3, 2010, which claims priority to Japanese Patent Application No. 2009-157449, filed Jul. 2, 2009, each of which is hereby incorporated by reference in the present disclosure in its entirety.

TECHNICAL FIELD

The present invention relates to organic electroluminescence (EL) elements, methods for manufacturing the same, and organic EL display devices using the same.

BACKGROUND ART

Recently, organic EL elements have been actively developed. Display devices using organic EL elements need neither backlights nor polarizers, and have a wide dynamic range and a wide viewing angle, which is advantageous for reduction in thickness and cost. Thus, the organic EL elements have been expected to be used in next-generation display devices.

In typical organic EL elements, an organic EL layer that emits light in response to application of a voltage is provided between a thin-film like anode and a thin-film like cathode, and a hole injection layer, a hole transport layer, a light emitting layer, a hole blocking layer, an electron transport layer, etc. are stacked in the organic EL layer.

These layers in the organic EL layer are often formed by vacuum deposition (a vacuum deposition method), but in some cases, are formed by coating using spin coating etc. (a coating method).

In order to display a color image on organic EL display devices, three sub-pixels of red (R), green (G), and blue (B) are typically arranged in each pixel, and light emission of the sub-pixels is controlled. This method requires a light emitting layer that emits light of each color to be selectively formed in each sub-pixel (patterning).

However, a patterning technique capable of being used in practical applications has not been established in the field of organic EL display devices. In particular, there has been a problem in a process for increasing the size of the display devices.

Some techniques have been proposed as this type of patterning technique (Patent Document 1 etc.).

(1) Patent Document 1

A metal mask having holes is used. Patterning is performed through the holes of the metal mask by vacuum deposition (a mask deposition method).

(2) Non-Patent Documents 1-3

A transfer substrate is used on which a photothermal conversion layer that converts laser light to thermal energy and a light emitting layer are formed on its entire surface. With the transfer substrate being placed to face a transfer target substrate, a predetermined area of the transfer substrate is irradiated with laser. Thus, only the light emitting layer in the irradiated area is transferred to the transfer target substrate (a laser transfer method).

(3) Patent Document 2

Small droplets are dropped onto predetermined positions to form a thin film (an ink jet method or IJ method).

(4) Patent Document 3

A transfer substrate having light emitting pigments of RGB arranged thereon is used as a substrate that allows laser light to pass therethrough. The transfer substrate is externally irradiated with laser light, thereby transferring the light emitting pigments by using heat generated by the laser light. All the light emitting pigments are simultaneously formed on the transfer substrate. An IJ method or a vacuum deposition method is used to form the light emitting pigments.

(5) Patent Document 4

A first transfer layer containing a first organic material and a second transfer layer containing a second organic material are patterned on a transfer substrate via a photothermal conversion layer by a printing method. The transfer layers are simultaneously transferred to a transfer target substrate by irradiating this transfer substrate with radiation.

CITATION LIST

Patent Documents

PATENT DOCUMENT 1: Japanese Patent Publication No. 2002-075638
PATENT DOCUMENT 2: Japanese Patent Publication No. 2000-106278
PATENT DOCUMENT 3: Japanese Patent Publication No. 2004-87143
PATENT DOCUMENT 4: Japanese Patent Publication No. 2008-235011

Non-Patent Documents

NON-PATENT DOCUMENT 1: 16.5L: Late-News-Paper: Non-Contact OLED Color Patterning by Radiation-Induced Sublimation Transfer (RIST), "SID 05 DIGEST," pp. 972-975
NON-PATENT DOCUMENT 2: 21.3: A New Patterning Method for Full-Color Polymer Light-Emitting Devices: Laser Induced Thermal Imaging (LITI), "SID 02 DIGEST," pp. 784-787
NON-PATENT DOCUMENT 3: 53.2: Distinguished Paper: Novel Laser Transfer Technology for Manufacturing Large-Sized OLED Displays, "SID 07 DIGEST," pp. 1592-1595

SUMMARY OF THE INVENTION

Technical Problem

However, the patterning techniques disclosed in the above Patent Documents etc. have the following problems.

(1) Patent Document (Mask Deposition Method)

Since a material is also deposited on the mask, only part of the material can be actually used. For example, in the case where the material is separately deposited in the three sub-pixels of RGB by the mask deposition method in order to obtain color display, the material utilization efficiency is no more than several percent. Moreover, there is a large distance (TS distance) between an evaporation source and a substrate. Thus, a defective film may be formed depending on the position of the evaporation source, because deposition may be hindered by the mask. Moreover, for larger-sized display devices, the mask area need also be increased accordingly, which limits the use of this method in manufacturing of large-sized display devices.

(2) Non-Patent Documents 1-3 (Laser Transfer Method)

Since patterning is performed by laser scanning, the material utilization efficiency is not reduced as in the mask deposition method. However, laser scanning accuracy depends on mechanical accuracy, and for example, a meander in the XY direction or a shift in the Z direction (a shift of the depth of focus of laser) may result in formation of an uneven film or a film having an insufficiently transferred area. Moreover, since scanning is basically performed on each line of RGB, increasing the number of lines increases the cycle time, and the use of a plurality of lasers for scanning increases the manufacturing cost.

(3) Patent Document 2 (IJ Method)

Since a film can be formed by dropping droplets onto desired positions, this method is advantageous in that patterning can be performed on demand. In the inkjet method, however, accuracy of the dropping positions of the droplets is not so high due to a mechanical displacement, clogging of a head, etc. In the case of forming RGB sub-pixels of different colors, color mixture may occur due to scattering of the solution. In order to form a uniform film, an enclosure called a "bank" need be formed to contain the solution to be dropped, or a surface treatment need be performed to sufficiently increase a lyophilic property of a region where the film is to be formed. Thus, a preparatory process tends to be complicated. The surface treatment may also degrade characteristics of the film. Moreover, since films containing materials that are soluble in the same solvent cannot be directly stacked together, the kinds of materials that can be used are limited. Thus, the inkjet method has not been able to be used for materials and stacked structures having the best characteristics so far obtained.

(4) Patent Document 3

A transfer substrate need be produced on which light emitting layers of RGB have been patterned in advance by an IJ method or a vacuum deposition method. Thus, the transfer substrate itself has problems of the patterning methods described above. Accordingly, using this transfer substrate does not necessarily ensure accurate patterning, and also increases manufacturing cost.

(5) Patent Document 4

Since the printing method is used, the transfer layers can be relatively easily formed on the transfer substrate. However, a printing plate is used in the printing method. The printing plate contracts depending on the temperature and the solvent, and a printing apparatus has a mechanical variation such as a rotation displacement of the printing plate etc. Thus, the larger the size of the display devices becomes, the more difficult it becomes to achieve satisfactory accuracy. In particular, in gravure printing, a printing plate needs to have opposite functions. Namely, a material need be first transferred (adsorbed) to the printing plate, and then need be delaminated from the printing plate so as to be transferred to the substrate. Thus, pinholes tend to be formed.

Moreover, there is a problem of contamination in the case of using a plurality of materials. That is, it is difficult to completely prevent adhesion of the materials to a portion other than the printing plate during printing. Thus, contamination tends to be caused in the case of patterning different materials in adjoining regions. A film (a layer) to be formed is typically as thin as about several nanometers to about several tens of nanometers. Thus, even slight contamination degrades characteristics.

Moreover, in a method in which the two transfer layers are simultaneously transferred to the substrate on a pixel-by-pixel basis, the cycle time can be reduced as compared to a normal laser transfer method, but significant reduction (significantly reduced cycle time) cannot be expected.

It is an object of the present invention to provide a manufacturing method of an organic EL element etc., which is capable of implementing reduced cycle time and an increased size of display devices at low cost.

Solution to the Problem

In order to achieve the above object, according to the present invention, a method for manufacturing an organic EL element including an element substrate, a pair of electrodes comprised of an anode and a cathode and provided over the element substrate, and an organic layer formed between the electrodes and including a light emitting layer that emits light in response to application of a voltage includes: a lower electrode formation step of forming a lower one of the pair of electrodes on the element substrate; a transfer substrate fabrication step of patterning a transfer layer by performing a film-forming treatment of forming a film on at least one donor substrate by using at least one film-forming solution including a stacking material forming the organic layer, thereby fabricating at least one transfer substrate; an opposing arrangement step of arranging the transfer substrate and the element substrate so as to face each other with spacers interposed therebetween, such that a surface of the transfer substrate, which has the transfer layer formed thereon, faces the element substrate having the lower electrode formed thereon; a depressurization step of holding the transfer substrate and the element substrate, which face each other, under vacuum conditions; and a transfer step of heating the transfer substrate under the vacuum conditions by a heat source to transfer the transfer layer to the element substrate.

An organic EL element that is manufactured by this method having this configuration may include e.g., the spacers provided on the element substrate, wherein an equal-thickness layer having substantially a same thickness both on the element substrate and on the spacers is included in the organic layer.

An organic EL display device may include the above organic EL element, wherein an active matrix drive is preferably used in the display device.

Advantages of the Invention

In the manufacturing method of the organic EL element etc. according to the present invention, material utilization efficiency can be improved, cycle time can be reduced, and a manufacturing apparatus can be simplified. Thus, reduced manufacturing cost and larger-sized display devices can be implemented. Moreover, performance of the organic EL element can be improved such as reduction in leakage current.

BRIEF DESCRIPTION OF THE DRAWINGS

FIGS. 13A-13B are illustrations of a treatment of bringing a transfer substrate and an element substrate into close contact with each other by using a pressure bonding apparatus.

FIG. 26A is a plan view and FIG. 26B is a cross-sectional view.

FIG. 28B is a schematic enlarged view of a portion shown by two-dot chain line in FIG. 28A.

FIGS. 29A-29F are flow diagrams illustrating a manufacturing process in the first example.

FIG. 31A is a plan view, and FIG. 31B is a cross-sectional view.

FIG. 32A is a plan view, and FIG. 32B is a cross-sectional view.

FIG. 33A is a plan view, and FIG. 33B is a side view.

FIG. 35A is a plan view, and FIG. 35B is a side view.

FIG. 40A is a schematic plan view of the heat source, and FIG. 40B is a schematic plan view of an element substrate.

FIG. 41A is a schematic plan view of the heat source, and FIG. 41B is a schematic plan view of an element substrate.

DESCRIPTION OF EMBODIMENTS

Figure 1:
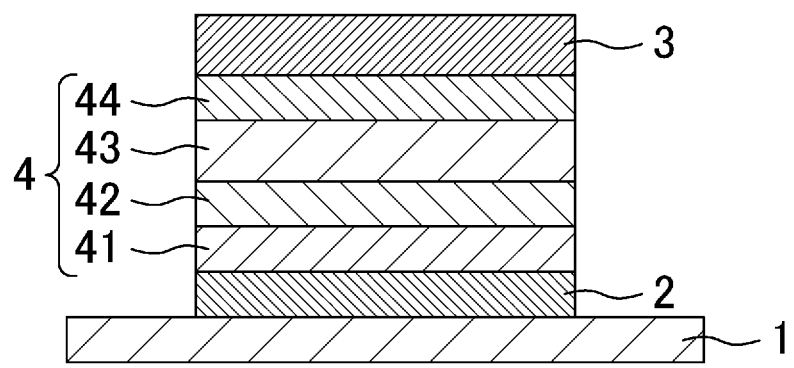
FIG. 1 is a schematic view showing a structure of an organic EL element according to an embodiment.

An embodiment of the present invention will be described in detail below with reference to the accompanying drawings. The following description is by way of illustration only, and is not intended to limit the present invention, and its applications or uses. Note that common members are denoted with the same reference characters throughout the figures unless otherwise mentioned.

Outline of Embodiment

FIG. 1 is a schematic view showing a structure of an organic EL element in the present embodiment. This organic EL element includes, over an element substrate 1, a pair of electrodes formed by an anode 2 and a cathode 3, and an organic layer 4 provided between the electrodes 2, 3 and including a light emitting layer 43 that emits light in response to application of a voltage. In FIG. 1, reference character "41" represents a hole injection layer, reference character "42" represents a hole transport layer, and reference character "44" represents an electron transport layer.

FIGS. 2A-2D show an outline of a method for manufacturing the organic EL element in the present embodiment. In FIGS. 2A-2D, reference character "10" represents a donor substrate, reference character "11" represents a transfer layer, reference character "12" represents a transfer substrate, reference character "13" represents a spacer, reference character "14" represents a vacuum chamber, and reference character "15" represents a heat source. A transfer substrate 12 that is fabricated by using the donor substrate 10 is used as an auxiliary substrate during manufacturing. A vacuum chamber 14 is an apparatus capable of depressurizing the chamber to high vacuum. A heat source 15 is formed in the shape of a flat plate, and is placed on an inner wall surface of the vacuum chamber 14 so that the thermal-energy emitting surface of the heat source 15 faces inward.

This manufacturing method includes the following steps.

<Lower Electrode Formation Step> A lower electrode (the anode 2) is formed on the element substrate 1.

<Transfer Substrate Fabrication Step> By using a film-forming solution containing a stacking material that forms the organic layer 4, a film-forming treatment of forming a film on the donor substrate 10 is performed to pattern a transfer layer 11, thereby fabricating the transfer substrate 12.

<Opposing Arrangement Step> The transfer substrate 12 and the element substrate 1 are placed so as to face each other with spacers 13 interposed therebetween, such that the surface of the transfer substrate 12, which has the transfer layer 11 formed thereon, faces the element substrate 1 having the lower electrode formed thereon.

<Depressurization Step> The transfer substrate 12 and the element substrate 1 facing each other are held under vacuum conditions.

<Transfer Step> The transfer substrate 12 is heated by the heat source 15 under the vacuum conditions to transfer the transfer layer 11 to the element substrate 1.

Figure 2A:
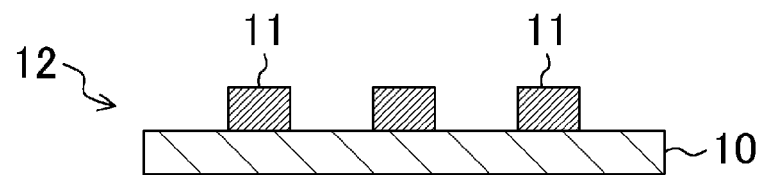
FIGS. 2A-2D are schematic diagrams illustrating main steps of a method for manufacturing the organic EL element according to the embodiment.

Specifically, as shown in FIG. 2A, a stacking material is patterned on the donor substrate 10, thereby fabricating the transfer substrate 12 having the transfer layer 11 formed thereon. The spacers 13 are provided in advance on the element substrate 1. The spacers 13 may be provided on the transfer substrate 12.

Figure 2B:
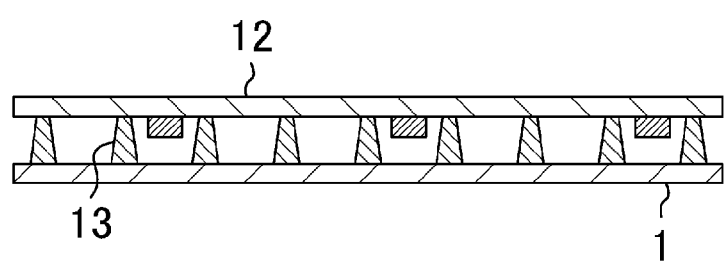
Figure 2C:
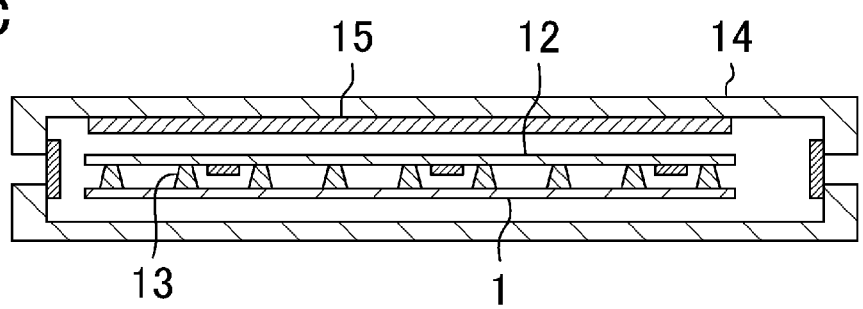

Then, as shown in FIG. 2B, the element substrate 1 and the transfer substrate 12 are bonded together so as to face each other. At this time, alignment is performed as required. Thereafter, as shown in FIG. 2C, the substrates 1, 12 bonded together are held under vacuum conditions by using the vacuum chamber 14.

Figure 2D:
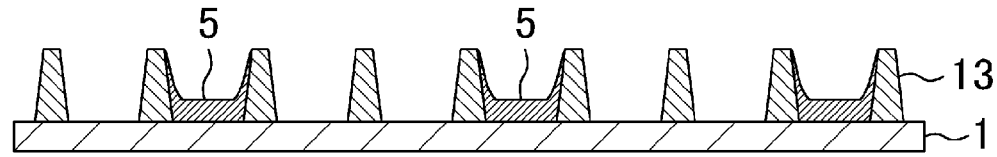

Then, the heat source 15 is heated, whereby the transfer layer 11 is sublimated and transferred to the element substrate 1. Thus, as shown in FIG. 2D, an organic film 5 comprised of the stacking material can be patterned on the element substrate 1 in a relatively short time. In order to form a high-quality organic film 5, it is important to maintain a uniform small gap (corresponding to the TS distance) between the transfer substrate 12 and the element substrate 1 by the spacers 13.

As described above, in this manufacturing method, an evaporation source is placed in each of the areas corresponding to the patterning areas of the element substrate 1, and is thermally deposited at a very short TS distance. Thus, according to the manufacturing method, the conventional problem can be reduced, namely the material utilization efficiency can be improved, while using the advantages of the vacuum deposition method.

Moreover, since the stacking material need only be formed in advance on the donor substrate 10 by a coating method etc., shorter cycle time and lower cost can be implemented. Moreover, impurities such as oxygen or water that have entered the film during the film formation are removed in the depressurization step and the transfer step, performance can also be improved.

Specific Configuration of Embodiment

A specific configuration of the manufacturing method will be described below.

It is preferable that the "transfer substrate fabrication step be performed under atmospheric pressure conditions." Since materials of the light emitting layer 43, the hole injection layer 41, etc. forming the organic EL element tend to be degraded by oxygen or water, it is essentially not preferable to form a film by using a wet coating method etc. under the atmospheric pressure. However, according to the manufacturing method of the present embodiment, oxygen etc. is removed in the subsequent depressurization and transfer steps. Thus, the transfer substrate 12 can be fabricated under the atmospheric pressure, thereby facilitating fabrication.

It is preferable that the "transfer substrate fabrication step be performed under such conditions that a dew-point temperature is −20° C. or less." This is because performing this step in a dry atmosphere (dry air) allows water to be more effectively removed. The dew-point temperature higher than −20° C. may destabilize the dry atmosphere. Dry air having a dew-point temperature of about −20° C. can be produced by using existing pneumatic apparatuses, whereby manufacturing cost can be reduced.

Since the stacking material is transferred under vacuum conditions, a film equivalent to that of a conventional vacuum deposition method can be formed. Since a very short TS distance is maintained by the spacers 13, uniform deposition can be achieved under stable deposition conditions, and almost all of the stacking material can be transferred to the element substrate 1. Thus, the material utilization efficiency of this manufacturing method is further improved over the coating method having high material utilization efficiency.

It is preferable that the "transfer step be performed under such conditions that a degree of vacuum is $1 \times 10^{-3}$ Pa or less." Performing the transfer step under high vacuum conditions with a degree of vacuum of $10^{-3}$ Pa or less can reduce the heating temperature required to sublimate the stacking material, and can reduce thermal degradation of the stacking material. Performing the transfer step under low vacuum having a degree of vacuum higher than $10^{-3}$ Pa may cause thermal degradation of the stacking material.

It is preferable that the "transfer layer 11 be comprised of a low molecular organic material (also referred to as the 'low molecular material')." That is, the low molecular organic material is used as the stacking material. Low molecular materials are commonly used in organic EL elements, and a vacuum deposition method is typically used to stack such a low molecular material. A coating method etc. is essentially more desirable in view of convenience of the manufacturing process and cost for apparatuses. However, since many of the low molecular materials do not have a sufficient self-supporting property, it is difficult to form a high quality film by the coating method etc.

In the present embodiment, a uniform organic film 5 can be formed on the element substrate 1 by sublimation during deposition. Thus, a high quality film need not be formed on the donor substrate 10, and a film need only be selectively formed on a patterning area as an evaporation source. That is, even a film of the low molecular material, which can be formed only by the vapor deposition method in conventional examples, can be formed with high material utilization efficiency in the present embodiment.

Moreover, one manufacturing problem of the vacuum deposition method using the low molecular material is that the deposition rate varies depending on the kind of low molecular material. On the other hand, in this manufacturing method, high-speed transfer can be achieved by appropriately performing a heating method by using the heat source 15. A manufacturing method that has generally hardly affected by the difference in deposition rate and has reduced cycle time can be implemented by the present embodiment.

Figure 3:
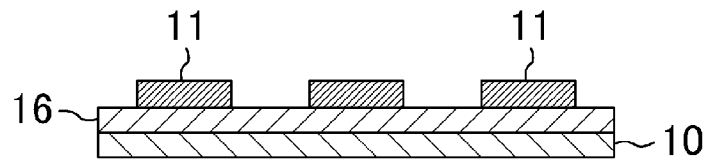
FIG. 3 is a schematic diagram of a transfer substrate.

As shown in FIG. 3, it is preferable that the "donor substrate 10 be comprised of a material that allows thermal energy emitted from the heat source 15 to pass therethrough, and a heat generating layer 16 that absorbs the thermal energy be provided on a surface of the donor substrate 10, on which the transfer layer 11 is to be provided."

The heat source 15 is used in the transfer treatment in this manufacturing method, and for example, a flash anneal lamp, a halogen lamp, a xenon lamp, an infrared radiation apparatus, a surface emission laser, a heater, etc. can be used as the heat source 15. The transfer layer 11 is heated by thermal energy emitted from the heat source 15.

Thus, since the heat generating layer 16 that absorbs the thermal energy and converts the thermal energy to heat is provided on the surface that contacts the transfer layer 11 on the donor substrate 10, the transfer layer 11 can be more efficiently heated, and transfer can be facilitated.

The heat generating layer 16 is preferably comprised of, e.g., a metal such as aluminum (Al) that is highly thermally conductive. In particular, in view of reflection characteristics, titanium (Ti) is preferable in the case where a xenon lamp is used as the heat source 15, and molybdenum (Mo) is preferable in the case where an infrared radiation apparatus that radiates infrared rays of about 800 nm is used as the heat source 15. The material of the heat generating layer 16 is not limited to the metals, and the heat generating layer 16 may be comprised of other materials such as a resin containing a pigment.

Figure 4:
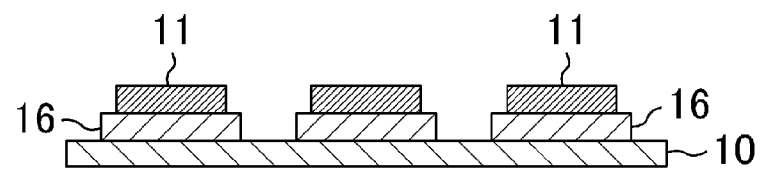
FIG. 4 is a schematic diagram of a transfer substrate.

As shown in FIG. 4, it is preferable that the "heat generating layer 16 be patterned in substantially a same area as a patterning area of the transfer layer 11 so as to overlap the patterning area of the transfer layer 11." Moreover, it is more preferable that the heat generating layer 16 be patterned so as to be slightly larger than the transfer layer 11.

Since the heat generating layer 16 is patterned, the area where the heat generating layer 16 is formed on the transfer substrate 12 is intensively heated in the transfer step. In the transfer substrate fabrication step, there is a possibility that the transfer layer 11 may be formed in an area other than the predetermined area due to misalignment etc. In such a case, heating the entire surface of the transfer substrate 12 may cause the transfer layer 11 to be transferred to an area other than a desired patterning area on the element substrate 1, resulting in color mixture or a non-uniform film thickness.

Thus, by patterning the heat generating layer 16 so that the patterning area of the heat generating layer 16 substantially overlaps the patterning area of the transfer layer 11, such color mixture and non-uniform film thickness, if any, can be reduced.

The "donor substrate 10 may be comprised of a material (also referred to as a heat absorbing material) that absorbs thermal energy emitted from the heat source 15." In this case, since the donor substrate 10 functions as the heat generating layer 16 as well, the configuration can be simplified. Depending on the type of heat source 15, the donor substrate 10 may be in a form such as a metal plate or a band-shaped metal sheet capable of being wound up into a roll, although the donor substrate 10 is not limited to these forms.

Figure 5:
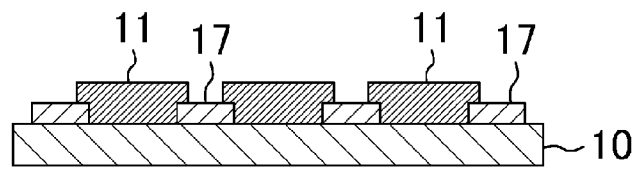
FIG. 5 is a schematic diagram of a transfer substrate.

As shown in FIG. 5, in this case, it is preferable that a "heating preventing layer 17 configured to prevent heating be formed in an area other than the patterning area of the transfer layer 11 on the donor substrate 10." The configuration of the donor substrate 10 is simplified if the donor substrate 10 is comprised only of the heat absorbing material. However, since the entire surface of the donor substrate 10 is heated, the use of such a donor substrate 10 may result in color mixture or a non-uniform film thickness. In this example, the heating preventing layer 17 that prevents heating is formed in the predetermined area, whereby only the area other than the predetermined area can be selectively heated.

The heating preventing layer 17 is preferably comprised of, e.g., a low thermally conductive material, or a material having such characteristics that reflect the thermal energy emitted from the heat source 15. Specific examples include an inorganic film such as $SiO_2$, $TiN_x$, or $TiO_x$, a resin film such as acrylic resin. The heating preventing layer 17 preferably has a thickness of several hundreds of nanometers or more in order to effectively perform its function.

It is preferable that the "spacers 13 be provided on the element substrate 1." If the spacers 13 are provided on the donor substrate 10 and transfer of the transfer layer 11 is performed a plurality of times in order to form a stack, the spacers 13 tend to be misaligned with respect to the element substrate 1 in each transfer. If such a misalignment occurs, the transfer area varies in every transfer. Thus, the transfer layer 11 may be unnecessarily transferred to an area other than the predetermined transfer area in the case of, e.g., a high-definition pixel size. By providing the spacers 13 on the element substrate 1, the transfer layer 11 can be transferred to the same area in every transfer even if the transfer is performed a plurality of times. Thus, stacking accuracy of the organic EL element can be improved.

The "spacers 13 may be provided on the donor substrate 10." Depending on the pixel size and the specifications, it may not cause any problem even if a small amount of the transfer layer 11 is transferred to an area other than the predetermined area. For example, in the case where the pixel size is relatively large as in large-sized televisions (TVs), a slight misalignment does not affect the quality. Thus, the spacers 13 can be formed on the donor substrate 10 in such a case. In the case of forming the spacers 13 on the element substrate 1, the spacers 13 need be formed on all the element substrates 1. However, in the case of forming the spacers 13 on the donor substrate 10, the number of spacers 13 can be significantly reduced because the donor substrate 10 can be repeatedly used. Since the number of spacers 13 is reduced, the material cost and the manufacturing cost can also be reduced accordingly.

Figure 6:
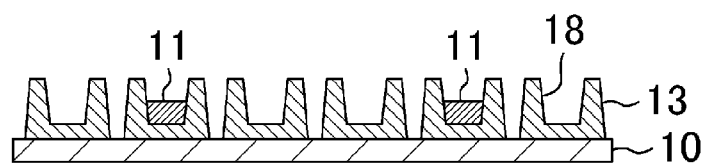
FIG. 6 is a schematic diagram of a transfer substrate.
Figure 7:
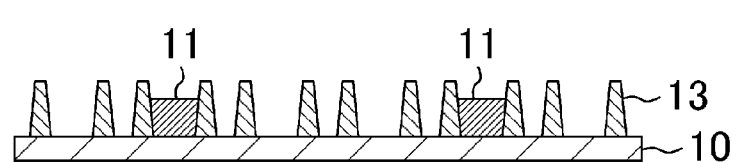
FIG. 7 is a schematic diagram of a transfer substrate.

It is preferable that the "spacers 13 be comprised of a material that absorbs thermal energy emitted from the heat source 15." As shown in FIG. 6, for example, spacers 13 having a substantially U-shaped cross section can be formed by patterning the heat generating layer 16 with a predetermined thickness into a band shape, and then forming groove-like recesses 18 in the upper ends of the band-shaped heat generating layers 16. In this case, the transfer layer 11 is formed in the recesses 18. This configuration allows the spacers 13 to function as the heat generating layer 16 as well. With such spacers 13, the transfer layer 11 can be heated from three directions, namely from the bottom surface and both side surfaces of the recess 18 of the spacer 13, whereby transfer can be efficiently preformed. As shown in FIG. 7, the spacers 13 themselves may be the heat generating layer 16.

Figure 8:
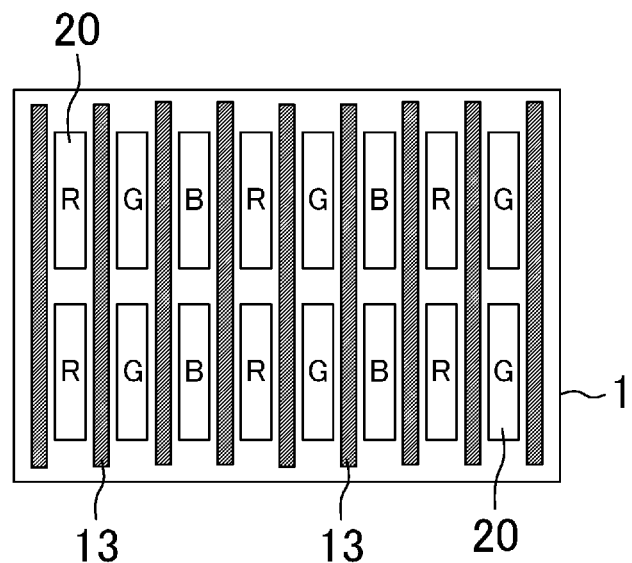
FIG. 8 is a schematic plan view illustrating an arrangement of spacers.

As shown in FIG. 8, the "spacers 13 may be arranged in a stripe pattern." In the case where a display device etc. is produced by using an organic EL element, the lower electrode formation step may include a treatment of patterning an electrode material into a grid shape to form a plurality of pixel electrodes 20 as the lower electrode. FIG. 8 shows an example of the element substrate 1 having the plurality of pixel electrodes 20 (the anode 2) arranged so as to correspond to sub-pixels of red (R), green (G), and blue (B) for color display devices.

Thus, sub-pixels of each color are arranged in a stripe pattern in some color display devices. In this case, although it is also important for the element substrate 1 to have a uniform film thickness over the entire surface, it is particularly important for the element substrate 1 to have a uniform film thickness in each area of the stripe pattern defined by the spacers 13. An optimal thickness of the sub pixels may vary depending on the color (RGB), and in that case, the sub-pixels of each color need be formed with their own optimal thickness. Thus, by arranging the plurality of linear spacers 13 in a stripe pattern, a layer having a uniform thickness can be formed in each area defined by the spacers 13.

Figure 9:
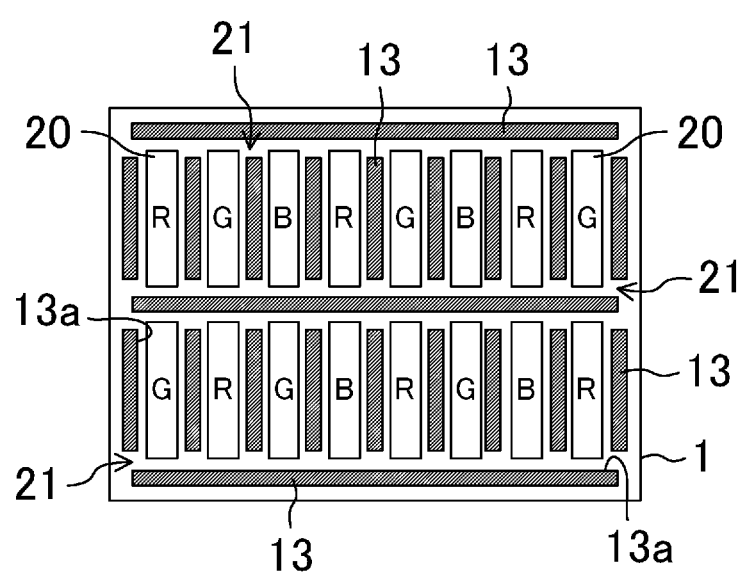
FIG. 9 is a schematic plan view illustrating an arrangement of spacers.

As shown in FIG. 9, the "spacers 13 may be arranged so as to surround each of the plurality of pixel electrodes 20, and openings 21 may be formed in surrounding surfaces 13a of the spacers 13 surrounding each of the pixel electrodes 20." As used herein, the surrounding surface 13a of the spacer 13 refers to a side surface of the spacer 13 extending substantially perpendicularly to the element substrate 1 and surrounding a corresponding one of the pixel electrodes 20.

Thus, the sub-pixels of RGB are arranged in a delta pattern in some color display devices. In this case, in order to ensure the optimal thickness of the sub-pixels of each color, the sub-pixels need be formed on a color-by-color basis. By surrounding each pixel electrode 20 with the spacers 13 in this manner, a layer of the sub-pixels having a uniform thickness can be formed on a color-by-color basis.

In this manufacturing method, depressurization is sometimes performed with the transfer substrate 12 and the element substrate 1 bonded together. In this case, if each pixel electrode 20 is entirely surrounded by the spacers 13, the region inside each pixel electrode 20 is hermetically sealed, and cannot be depressurized. Thus, the openings 21 communicating with the outside are formed in the surrounding surfaces 13a of the spacers 13 surrounding each pixel electrode 20, so that depressurization can be performed.

It is preferable that "in the transfer substrate fabrication step, the transfer layer 11 be patterned inside an area defined by the spacers 13, and has a smaller size than the area, as viewed in plan."

In this manufacturing method, the stacking material is sublimated and transferred to the element substrate 1 that is separated from the transfer substrate 12 by a short TS distance. At this time, the stacking material diffuses between the transfer substrate 12 and the element substrate 1 with no directionality. Thus, the stacking material is transferred to a larger area on the element substrate 1 than the area where the transfer layer 11 is formed on the transfer substrate 12. That is, the stacking material adheres to the spacers 13 etc. located in an area other than the predetermined area on the element substrate 1, whereby the material utilization efficiency is reduced.

The material utilization efficiency can be improved by providing the transfer layer 11 as shown in FIG. 10A, 10B, 11A, or 11B. In these figures, a hatched region represents the transfer layer 11.

Figure 10A:
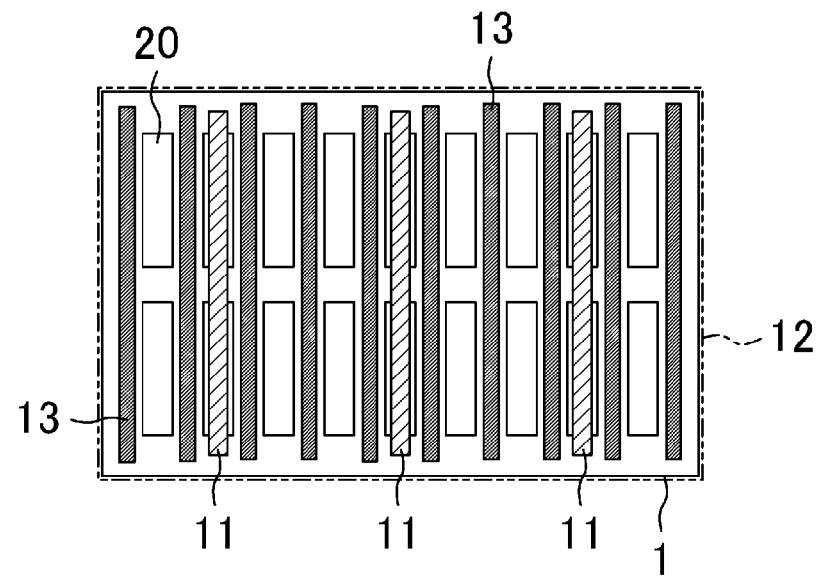
FIGS. 10A-10B are schematic plan views illustrating arrangements of transfer layers.

For example, as shown in FIG. 10A, the transfer layer 11 may be formed so as to extend along the spacers 13 arranged in a stripe pattern, as viewed in plan. Specifically, a band-shaped area is defined by the spacers 13, and a band-shaped transfer layer 11 is formed along the center of the width of the band-shaped area.

Figure 10B:
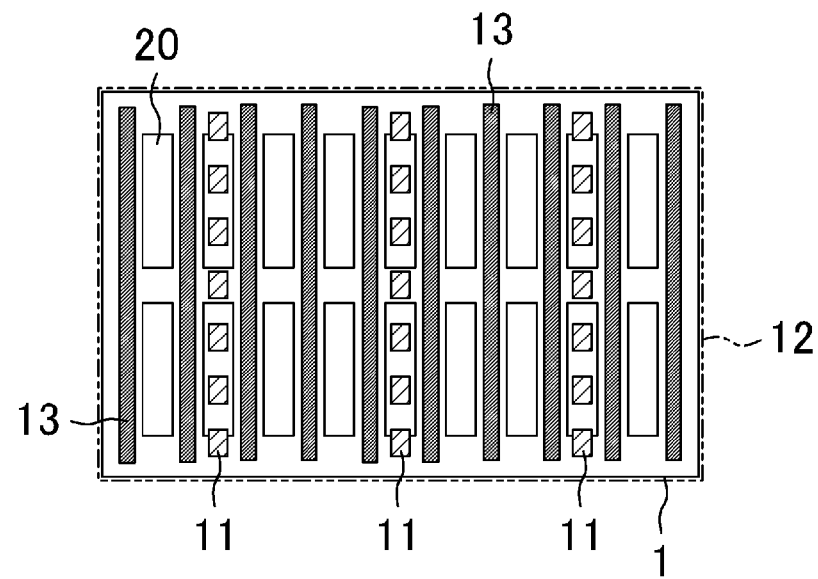

Alternatively, as shown in FIG. 10B, the "transfer layer 11 may be formed in a spot shape at least one position in the area." Since the stacking material diffuses with no directionality during transfer, more efficient film formation can be expected by forming the spot-shaped transfer layer 11.

Figure 11A:
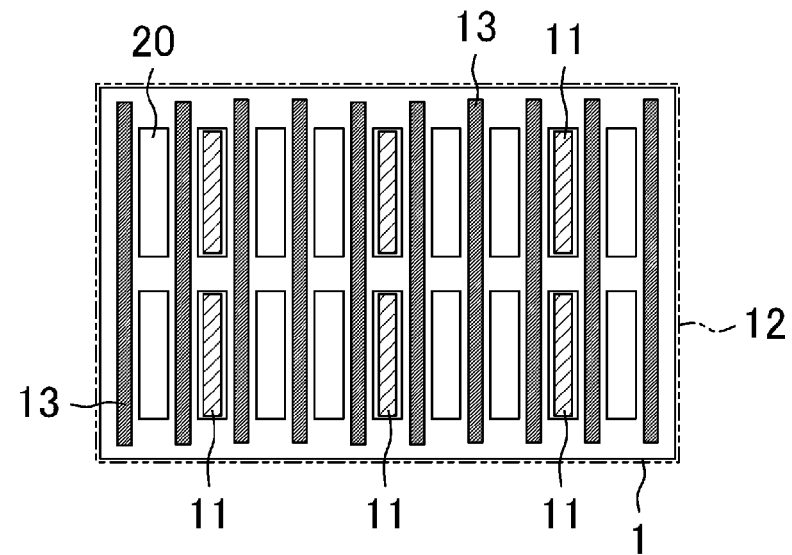
FIGS. 11A-11B are schematic plan views illustrating arrangements of transfer layers.
Figure 11B:
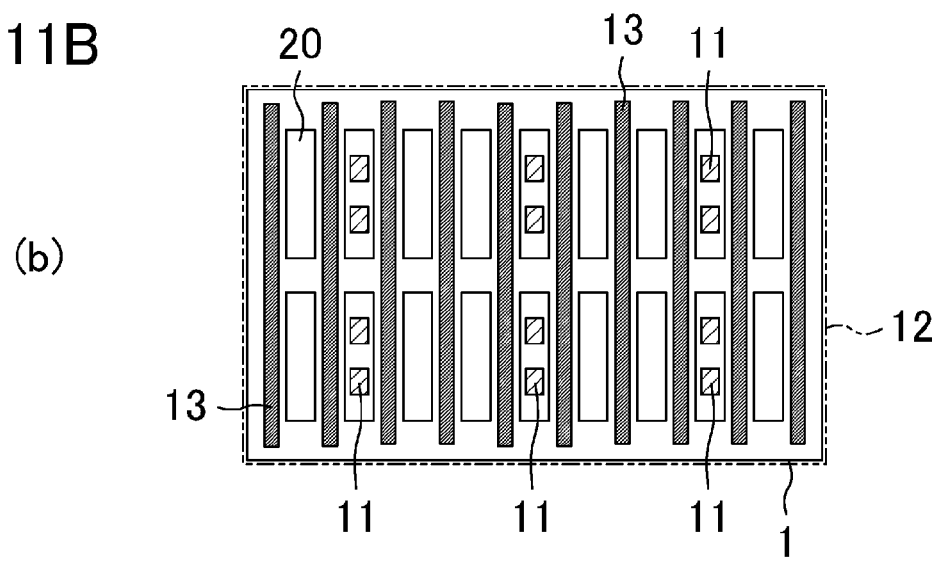

Alternatively, as shown in FIGS. 11A-11B, the "transfer layer 11 may be formed so as to be located inside an area corresponding to each of the pixel electrodes 20." This can further improve the material utilization efficiency.

It is preferable that "in the transfer substrate fabrication step, the transfer layer 11 be formed to have a film-like structure in which fine particles are continuously bonded together." As described above, since the stacking material is sublimated in the transfer step, the low molecular material can be used as the stacking material for forming a film. However, if the transfer layer 11 is extremely non-uniform due to a very short TS distance, the transfer layer 11 may affect the form of the transferred film.

However, if the transfer layer 11 is formed to have the film-like structure (also referred to as the "fine-particle bond film") in which fine particles are continuously bonded together, formation of an extremely non-uniform transfer layer 11 can be prevented. That is, the fine particles continuously bonded together reduce the possibility of formation of an extremely non-uniform film. Variation in sublimation of the transfer layer 11 is also reduced, whereby the transfer layer 11 can be uniformly transferred.

For example, a "small droplet spray method in which the film-forming solution is divided into droplets and sprayed can be used" as a method for forming such a fine-particle bond film. In this case, the droplets that are sprayed preferably have a mean particle size of 10 µm or less, and more preferably 1 µm or less. The smaller the droplets are, the more the surface area increases relatively. Thus, the droplets become dry as soon as they reach the donor substrate 10, whereby a satisfactory fine-particle bond film can be formed.

Specifically, the droplets may be sprayed by using a spray. In particular, the droplets that are sprayed may be electrically charged. Thus, the droplets are further divided into smaller droplets by an electrostatic force, whereby very small, uniform droplets can be stably formed. The small droplet spray method will be described later.

It is preferable that "in the transfer substrate fabrication step, a low boiling-point material is used as a solvent of the film-forming solution." The stacking material is formed on the donor substrate 10 by coating etc. At this time, a heat treatment is normally performed to remove oxygen or water contained in the film-forming solution. However, this heat treatment may reduce the quality of the stacking material. For example, performing the heat treatment by using a glove box etc. capable of removing oxygen etc. to a large extent can prevent such reduction in quality of the stacking material, but increases facility cost.

Thus, by using the low boiling-point solvent as the solvent, the solvent can be naturally removed in the course of coating. This eliminates the need for a drying treatment, or requires only a relatively weak drying treatment. As used herein, the term "low boiling point" means a boiling point of, e.g., 120° C. or less. A solvent having a boiling point of 120° C. or less can be dried substantially simultaneously with completion of the coating, eliminating the need for the drying treatment.

In particular, it is effective to combine the low boiling-point solvent with the small droplet spray method. This further facilitates drying, whereby reduction in quality of the stacking material can be suppressed, and the manufacturing cost can be reduced.

"In the transfer substrate fabrication step, a treatment of heating the donor substrate 10 may be performed while the transfer layer 11 is being patterned." Since the transfer substrate 12 is held under vacuum conditions in the subsequent depressurization step, it is preferable to remove the solvent as much as possible by the time the depressurization step is performed. Thus, the solvent can be efficiently removed by heating the donor substrate 10 while performing coating. Performing the heat treatment simultaneously with the coating eliminates the need to perform the heat treatment separately, whereby the number of manufacturing facilities and the number of manufacturing steps can be reduced.

"In the transfer substrate fabrication step, the film-forming solution can be produced by dispersing the stacking material in a solvent." A low molecular material having light emitting characteristics and a charge transport property is mainly used as the stacking material. This manufacturing method uses the film-forming solution to fabricate the transfer substrate 12. However, some stacking materials have significantly low solubility in the solvent, or characteristics of some stacking materials are degraded if the stacking materials are provided with solubility in the solvent. Thus, in the case of using such a stacking material, the stacking material need only be dispersed in the film-forming solution. This is because the transfer layer 11 need only function as an evaporation source, and need not be formed with high accuracy.

Examples of a method for preparing such a dispersion include a homogenizer using ultrasonic vibrations, a paint shaker, a bead mill, and a shear dispersion method, and an appropriate method may be used according to the kind of stacking material. Dispersibility is preferably 10 μm or less as primary particles, and is more preferably 1 μm or less in view of uniform diffusivity and a film-forming property at the time of transfer.

In this case, the "film-forming solution may contain an additive that enhances dispersibility of the stacking material." Agglomeration of the stacking material significantly degrades the film-forming property. Thus, adding the additive that enhances the dispersibility of the stacking material can prevent agglomeration of the stacking material.

Moreover, in this case, it is preferable that "a treatment of thermally decomposing the additive be performed in the transfer substrate fabrication step." If the additive remains in the transfer layer 11, this additive may adversely affect light emission characteristics and electrical characteristics of the organic layer 4 that is to be formed subsequently. Thus, such an adverse effect of the additive can be prevented by decomposing the additive by heating that is performed by the drying treatment. In this case, it is preferable to use an additive that is decomposed at a temperature used to perform the treatment of drying the solvent.

It is preferable that "in the depressurization step, a treatment of forming a hermetically sealed space between the transfer substrate 12 and the element substrate 1 be performed, and a pressure inside the hermetically sealed space be adjusted so as to be lower than that outside the hermetically sealed space." In other words, the pressure is adjusted so as to satisfy "Pa>Pb," where "Pa" represents the pressure outside the hermetically sealed space, and "Pb" represents the pressure inside the hermetically sealed space.

The transfer treatment is performed under vacuum conditions in the state in which the transfer substrate 12 faces the element substrate 1 with the spacers 13 therebetween. At this time, both substrates need be held at a constant TS distance from each other. In order to hold the substrates in this manner, it is preferable to press the substrates so that the entire surfaces of the substrates uniformly closely contact each other. Thus, the pressure inside the hermetically sealed space formed between the substrates is adjusted so as to be lower than that outside the hermetically sealed space, whereby the substrates are pressed by the pressure difference in such a direction that the substrates are brought into contact with each other.

Figure 12:
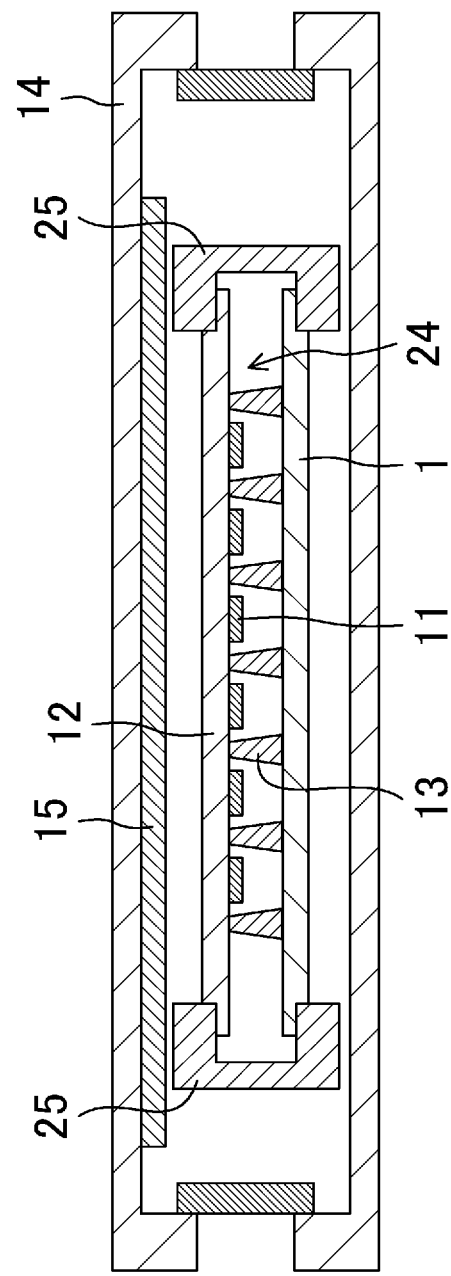
FIG. 12 is a conceptual diagram showing a state in which an element substrate etc. has been placed in a vacuum chamber.

FIG. 12 shows a specific example. In the figure, reference character "24" represents a hermetically sealed space, and reference character "25" represents a chuck.

First, the transfer substrate 12 and the element substrate 1 are bonded together so as to face each other in the vacuum chamber 14. In this state, the vacuum chamber 14 is depressurized to maintain a degree of vacuum of $1\times10^{-3}$ Pa. At this time, the space between the substrates 1, 12 has not been hermetically sealed. Thus, the space between the substrates 1, 12 has the same degree of vacuum as that in the vacuum chamber 14, which is $1\times10^{-3}$ Pa.

In this state, the ends of both substrates are held and sealed by the chuck 25, thereby forming a hermetically sealed space 24 between the substrates 1, 12. Thereafter, the degree of vacuum in the vacuum chamber 14 is reduced. Since the degree of vacuum in the hermetically sealed space 24 is maintained, reducing the degree of vacuum in the vacuum chamber 14 relatively reduces the pressure in the hermetically sealed space 24 accordingly, whereby the substrates 1, 12 are pressed in such a direction that the substrates 1, 12 are brought into contact with each other. Since the pressure is uniformly applied to both substrates 1, 12, a uniform TS distance can be maintained between the entire surfaces of the substrates 1, 12.

In addition to the pressure adjustment, a "treatment of physically bringing the transfer substrate 12 into close contact with the element substrate 1 may be performed by a pressure bonding apparatus."

FIGS. 13A-13B show a specific example. In these figures, reference character "26" represents an extendable frame capable of being elastically deformed, and reference character "27" represents a pressure bonding apparatus for pressing. The pressure bonding apparatus includes a base 27a that is attached to the bottom in the vacuum chamber 14, and a plate-like platform 27c located above the base 27a and attached to the base 27a via extendable legs 27b so as to face the base 27a. The platform 27c can be moved up and down.

In this case, if the transfer substrate 12 etc. is placed on the platform 27c as shown in FIG. 13A and the platform 27c is lifted, the transfer substrate 12 is brought into close contact with the heat source 15 as shown in FIG. 13B. The transfer substrate 12 can be made to firmly and closely contact the element substrate 1 by further lifting the platform 27c. The TS distance is adjusted by the extendable frame 26.

In this manner, a constant TS distance can also be maintained between the substrates by physically applying an external force between the transfer substrate 12 and the element substrate 1.

It is preferable that the "transfer substrate 12 include the heat generating layer 16, a light emitting apparatus be used as the heat source 15, and the heat generating layer 16 generate heat by absorbing light that is emitted from the light emitting apparatus." That is, light is emitted from the light emitting apparatus as the heat source 15 toward the transfer substrate 12. Thus, the heat generating layer 16 absorbs the light to generate heat, whereby the transfer layer 11 can be efficiently heated regardless of the type of stacking material. In particular, the light emitted from the light emitting apparatus is preferably visible light. This is because the area can be easily increased when the organic EL element is increased in size.

A "light emitting apparatus that emits infrared light may be used as the heat source 15." Since infrared light can directly heat the stacking material, the stacking material can be efficiently transferred. The heat generating layer 16 can be omitted if the donor substrate 10 is comprised of a material that allows infrared light to pass therethrough. Examples of this type of light emitting apparatus include a halogen lamp and a xenon lamp, although the light emitting apparatus is not limited to these. A filter that allows only infrared light to pass therethrough may be installed.

The "heat source 15 may emit pulsed radiation of thermal energy." Continuous irradiation of thermal energy may excessively increase the temperature, and may adversely affect the element substrate 1, the organic layer 4, etc. On the other hand, pulsed irradiation of thermal energy can prevent an excessive increase in temperature. Since the thermal energy is intermittently radiated only for a very short time, the thermal energy is not transmitted to a deep portion, whereby an increase in temperature of the element substrate 1 etc. located farther beyond the transfer substrate 12 can be suppressed.

Since the temperature decreases in a very short time, control is facilitated, and excessive heating can be prevented. Moreover, if the thermal energy is continuously radiated with the pulse time being reduced until a change in volume of the transfer layer 11 due to heat can no longer follow the pulse time, expansion energy is accumulated in the transfer layer 11, whereby the transfer efficiency can be increased.

The pulsed irradiation time is preferably, e.g., 100 msec or less, and is more preferably 1 μsec or less in order to increase the transfer efficiency. This can effectively prevent heat accumulation. In order to perform transfer by using expansion energy, the pulsed irradiation time is preferably 100 μsec or less, and more preferably 100 fsec or less.

Oscillations of the pulsed irradiation may be obtained by oscillating radiated light itself, or may be mechanically obtained by using a shutter.

"In the transfer step, at least two different regions of the transfer substrate 12 may be heated by the heat source 12 to perform transfer a plurality of times" (multiple transfer).

Transfer can be completed by single transfer by using the heat source 15 having about the same size as that of the transfer substrate 12. However, if the size is increased, an extensive treatment is required. Thus, transfer can be efficiently performed by dividing the transfer area into a plurality of regions, and conducting irradiation a plurality of times. FIGS. 14A-14B and 15A-15D show specific examples.

Figure 14A:
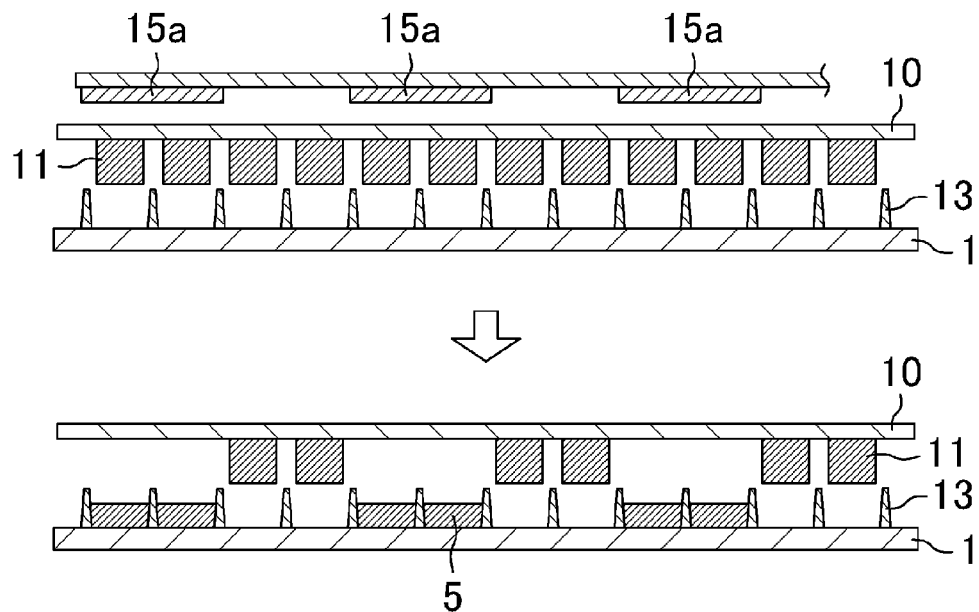
FIGS. 14A-14B are illustrations of multiple transfer.
Figure 14B:
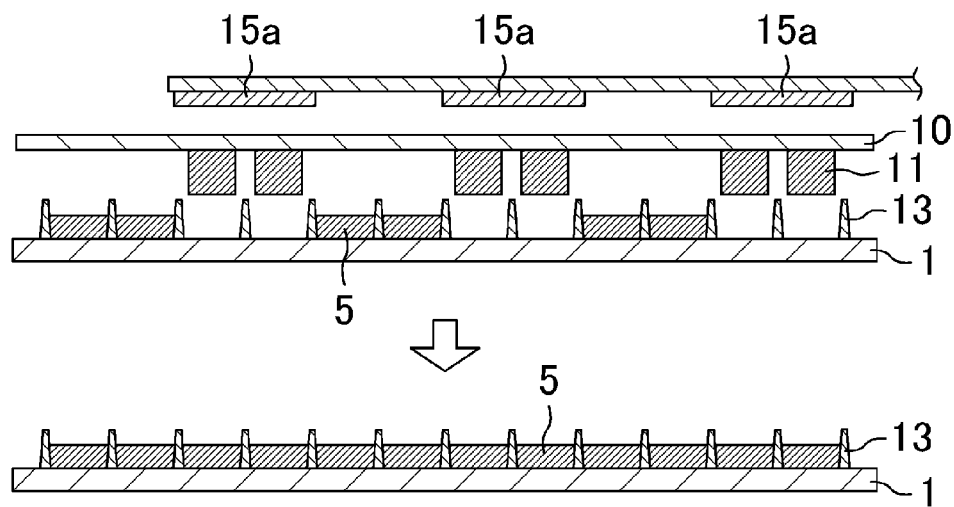

FIGS. 14A-14B show an example in which transfer is performed two times. Specifically, the heat source 15 is formed by a plurality of band-shaped element heat sources 15a arranged in a stripe pattern. The area where each element heat source 15a is provided is designed to have the same width as that of the area of the gap between adjoining ones of the element heat sources 15a. Each element heat source 15a is designed to have substantially the same length dimension as that of the transfer substrate 12.

First, in a first step, the element heat sources 15a are placed, and transfer is performed, as shown in FIG. 14A. Thus, those portions of the transfer layer 11 facing the element heat sources 15a are transferred to the element substrate 1, whereas those portions of the transfer layer 11 facing the gaps are not transferred to the element substrate 1.

Next, as a second step, the element heat sources 15a are shifted to the positions corresponding to the gaps, as shown in FIG. 14B. In this state, transfer is performed again, whereby the remaining transfer layer 11 can be transferred to the element substrate 1.

In this example, the transfer area is divided into a plurality of regions, and transfer is performed a plurality of times, whereby the transfer layer 11 can be efficiently transferred to the entire surface of the element substrate 1. Although the transfer area is divided into two regions in the above example, the present invention is not limited to this, and the transfer area may be divided into three or more regions.

FIGS. 15A-15D show an example of repetitive transfer, in which transfer is performed two times in each region while shifting the heat source 15. Specifically, the heat source 15 is formed in a band shape. The heat source 15 is designed to have substantially the same length dimension as that of the transfer substrate 12.

Figure 15A:
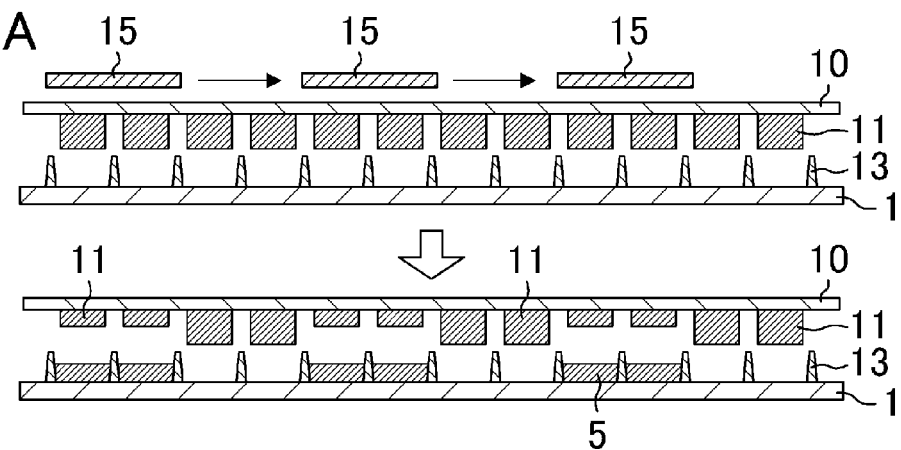
FIGS. 15A-15D are illustrations of multiple transfer.

First, in a first step, as shown in FIG. 15A, transfer is performed while shifting the heat source 15 from an end of the transfer substrate 12 in the lateral direction by a predetermined interval at a time. At this time, the amount of heating by the heat source 15 is adjusted so that only part of the transfer layer 11 is transferred. Thus, in each region where transfer has been performed, part of the transfer layer 11 has been transferred to the element substrate 1, whereas the remaining part of the transfer layer 11 remains on the donor substrate 10 without being transferred.

Figure 15B:
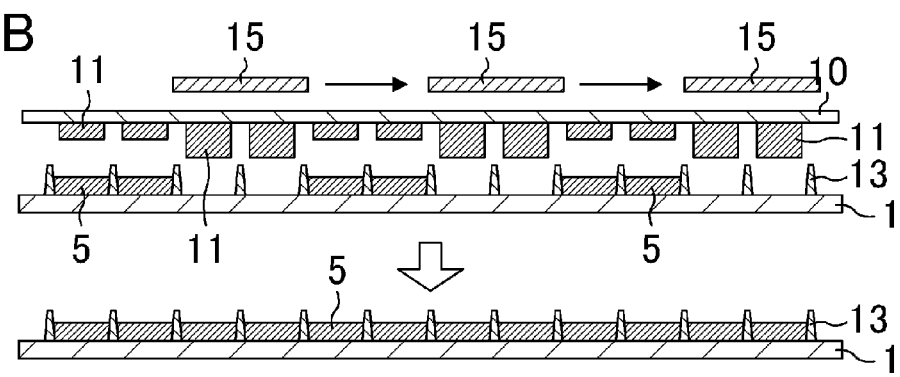

Next, in a second step, as shown in FIG. 15B, transfer is performed in a manner similar to that of the first step in those regions where transfer has not been performed. Thus, in each of these regions as well, part of the transfer layer 11 is transferred to the element substrate 1, whereby a film having a uniform thickness is formed over the entire surface of the element substrate 1.

Figure 15C:
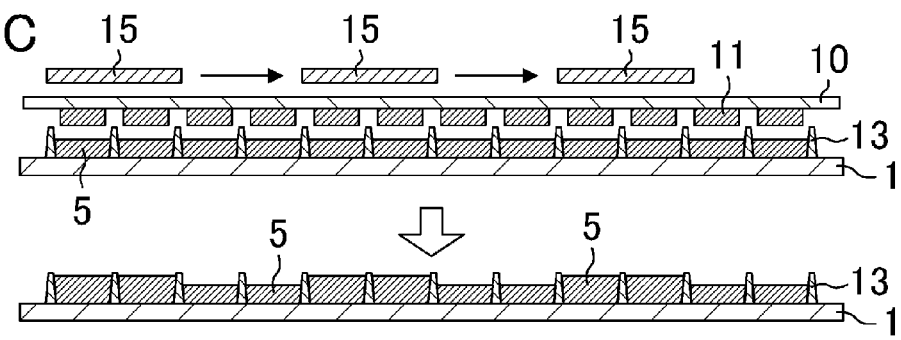
Figure 15D:
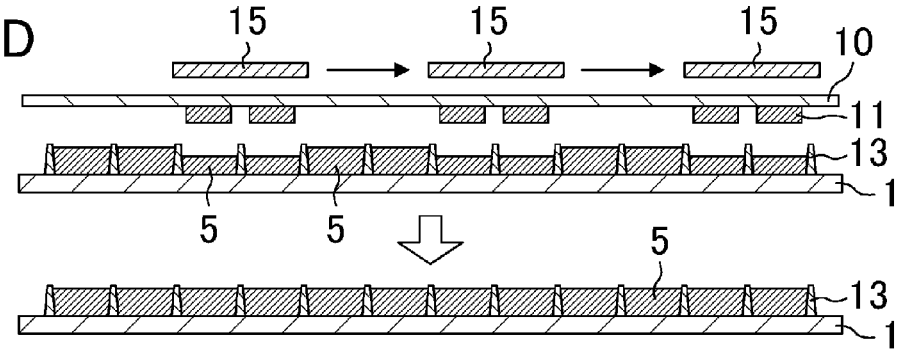

Moreover, in a third step, as shown in FIG. 15C, transfer is performed again in a manner similar to that of FIG. 15A to transfer the entire transfer layer 11 that has not been transferred in the first step. Furthermore, in a fourth step, as shown in FIG. 15D, transfer is performed again in a manner similar to that of FIG. 15B to transfer the entire transfer layer 11 that has not been transferred in the second step.

Thus, even if the transfer area is divided into a plurality of regions, and the amount of transfer layer 11 to be transferred by each transfer in each region is reduced so that transfer is performed a plurality of times in each region, the transfer layer 11 can be efficiently transferred to the entire surface of the element substrate 1. In this example, half of the transfer layer 11 is transferred by each transfer in each region. However, the present invention is not limited to this, and one third or less of the transfer layer 11 may be transferred by each transfer in each region.

The spacers 13 can be arranged in various patterns as appropriate.

For example, a "substrate with spacers may be formed by providing the spacers 13 on at least one of the transfer substrate 12 and the element substrate 1, a plurality of surrounding portions defined by the spacers 13 may be formed on one primary surface of the substrate with spacers, openings 21 may be formed in the surrounding surfaces 13a of the spacers 13 respectively surrounding the plurality of surrounding portions, the plurality of surrounding portions may communicate with each other via the openings 21, and at least one of the openings 21 may be placed at an end of the substrate with spacers so as to serve as an air outlet."

FIGS. 16A-20B show specific examples. In the figures, reference character "22" represents a surrounding portion. Although the spacers 13 may be provided on the transfer substrate 12, the spacers 13 are provided on the element substrate 1 (the substrate with spacers) in each of the examples. The element substrate 1 is bonded with the transfer substrate 12, whereby a plurality of spaces defined by the surrounding surfaces 13a of the spacers 13 are formed between the substrates.

Figure 16A:
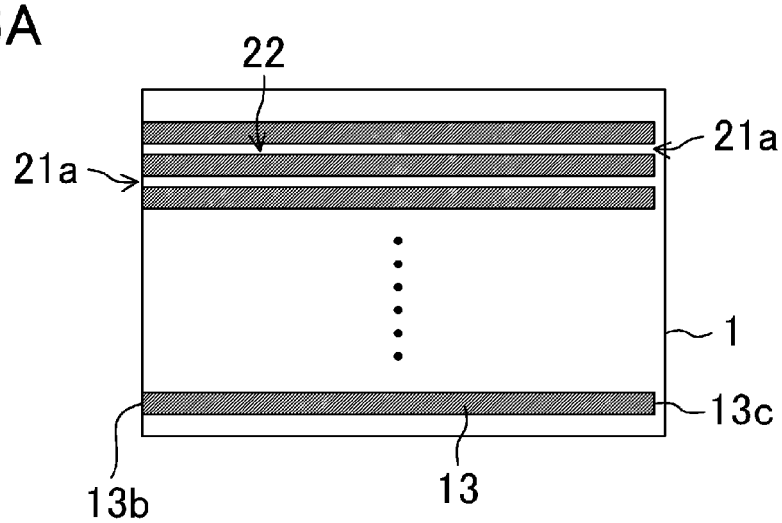
FIG. 16A is a schematic plan view showing a form of spacers.
Figure 16B:
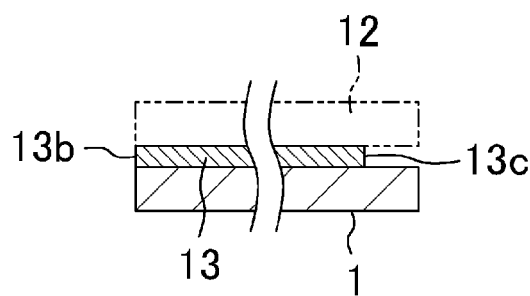
FIG. 16B is a cross-sectional view showing both ends of FIG. 16A

In FIGS. 16A-16B, the spacers 13 are formed in a linear shape, and are arranged parallel to each other in a stripe pattern. One end 13b of each spacer 13 extends to the edge of one side (the left side in the figures) of the element substrate 1. The other end 13c of each spacer 13 extends to a position close to the edge of the other side (the right side in the figures) of the element substrate 1.

In this example, the spacers 13 are arranged in a stripe pattern, and the spacers 13 do not extend to the edge of the element substrate 1 as shown on the right side of FIG. 16B. In this case, if a load is applied, the openings 21 may be narrowed because the end of the element substrate 1 become closer to the end of the transfer substrate 12, or the openings 21 may be closed because the respective ends of the substrates 1, 12 contact each other. This makes it difficult to remove air from the space between the substrates at the time of depressurization. Thus, by extending the ends of the spacers 13 to the edges of the element substrate 1, the openings 21 (air outlets 21a) through which air is removed can be secured at the ends of the substrates 1, 12, whereby air can be removed from the space between the substrates without difficulty.

It should be understood that the ends of the spacers 13 need not necessarily extend to the edges of the element substrate 1 if the air outlets 21a can be secured. In this case, it is preferable that the distance by which the ends of the spacers 13 are located inside the edge of the element substrate 1 be 1 mm or less.

The "spacers 13 may include an outer peripheral spacer 13A provided in a peripheral portion of the substrate with spacers so as to surround the substrate with spacers, and the air outlet 21*a* may be provided in a surrounding surface 13*a* of the outer peripheral spacer 13A."

Integrating the air outlets 21*a* increases convenience in performing the treatment. In particular, in the case of sealing the substrates 1, 12 by holding them together by the chuck 25, the substrates 1, 12 can be more easily sealed if the air outlet 21*a* is smaller. The outer peripheral spacer 13A can be provided in this case.

Figure 17:
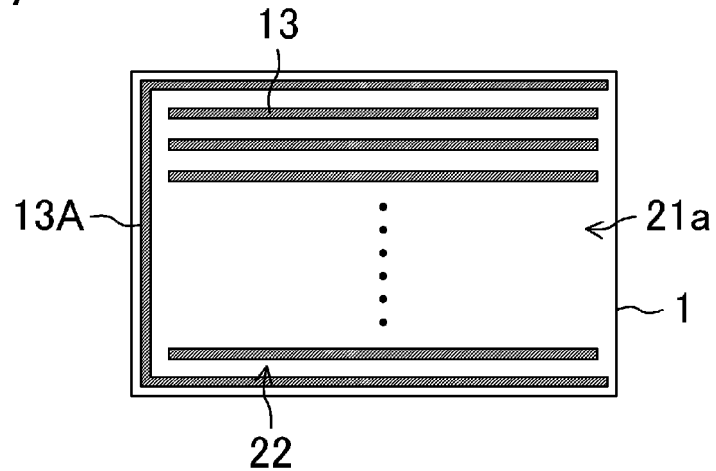
FIG. 17 is a schematic plan view showing a form of spacers.

FIG. 17 shows a specific example. In this example, the outer peripheral spacer 13A is formed in a U-shape as viewed in plan, and the air outlet 21*a* is formed in one side of the element substrate 1. Thus, in this case, only one side of the element substrate 1 is sealed by the chuck 25.

Figure 18:
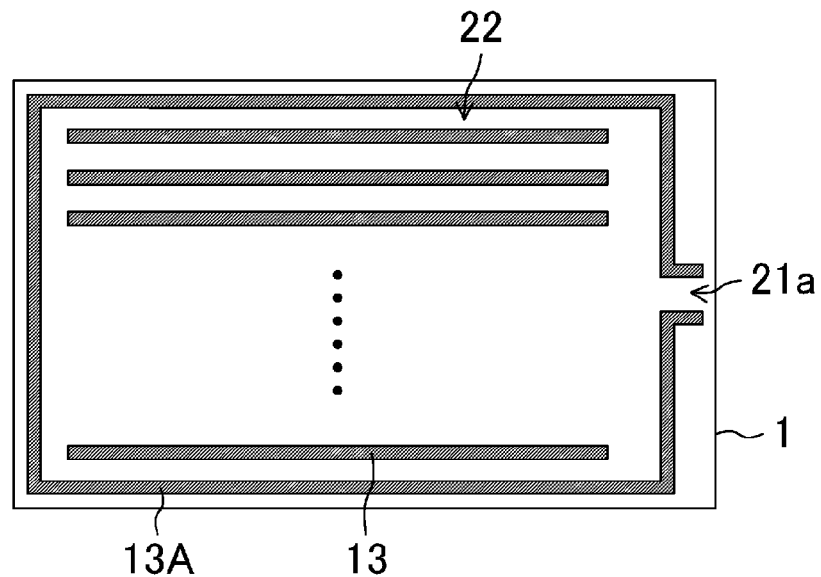
FIG. 18 is a schematic plan view showing a form of spacers.

As shown in FIG. 18, the air outlet 21*a* may be formed in a groove shape that opens at one position in the outer peripheral spacer 13A. This further facilitates sealing.

It is preferable that "in the case where the substrate with spacers is formed in a rectangular shape, the outer peripheral spacer 13A is formed symmetrically with respect to at least one of imaginary axes of symmetry extending along sides of the substrate with spacers and extending through a center of the primary surface."

When bonding the substrates 1, 12 and holding them together, uniformity is required so that the gap between the entire surfaces of the substrates is constant. Thus, symmetrically placing the outer peripheral spacer 13A enables the substrates to be held together in a well-balanced state, whereby the uniformity can be ensured.

Figure 19:
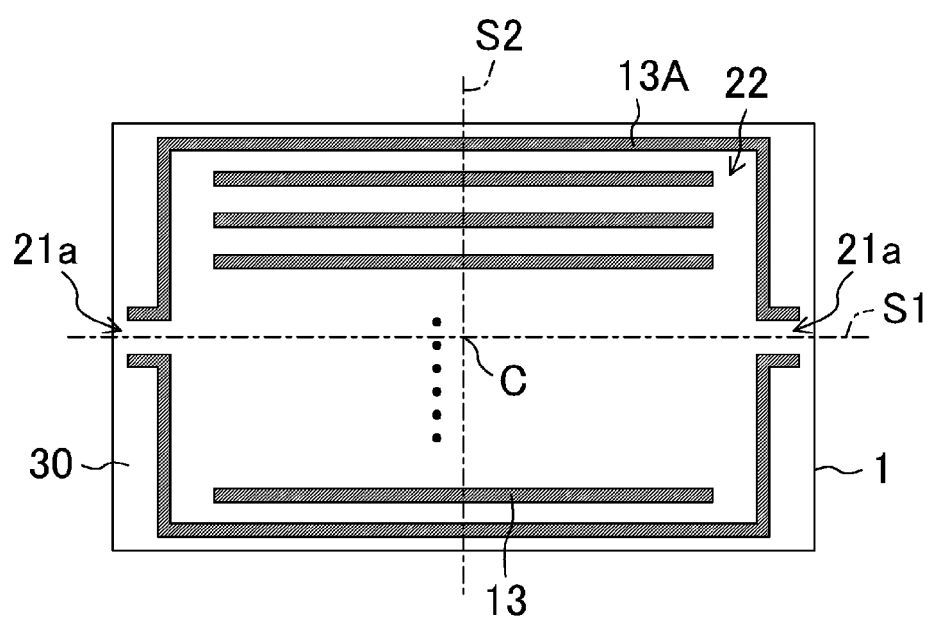
FIG. 19 is a schematic plan view showing a form of spacers.

FIG. 19 shows a specific example. In the figure, reference character "C" represents the center of a primary surface 30, and reference characters "S1," "S2" represent imaginary axes of symmetry. In the outer peripheral spacer 13A of this example, air outlets 21*a* are provided at two positions in a laterally symmetrical manner. The outer peripheral spacer 13A of FIG. 18 has a laterally asymmetrical shape, whereas the outer peripheral spacer 13A of this example has a vertically and laterally symmetrical shape. Thus, the uniformity can further be ensured.

Even if the outer peripheral spacer 13A has an asymmetrical shape, the symmetry can be complemented by providing dummy spacers. Specifically, the "outer peripheral spacer 13A may be formed asymmetrically with respect to at least one of the imaginary axes S1, S2 of symmetry extending along the sides of the substrate with spacers and extending through the center of the primary surface, and a dummy spacer complementing line symmetry of the outer peripheral spacer 13A may be provided in a periphery of the outer peripheral spacer 13A."

Figure 20A:
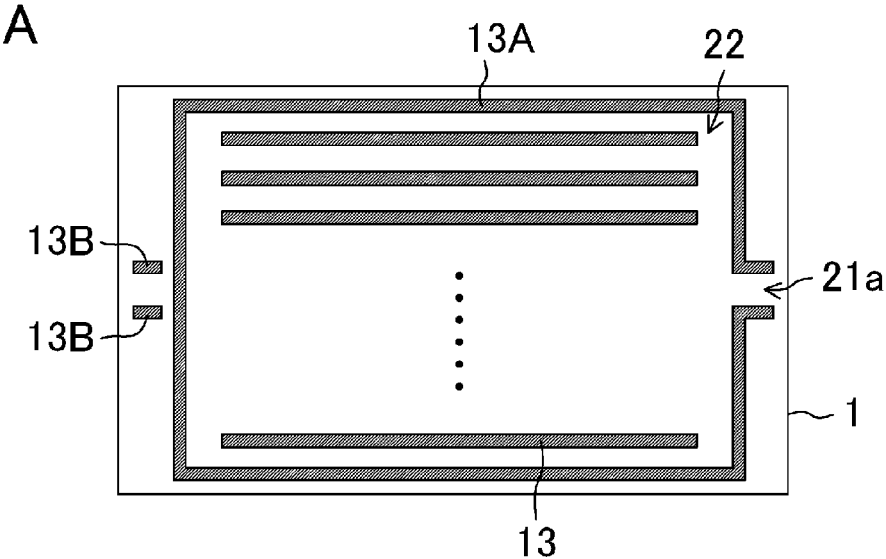
FIGS. 20A-20B are schematic plan views showing a form of spacers.
Figure 20B:
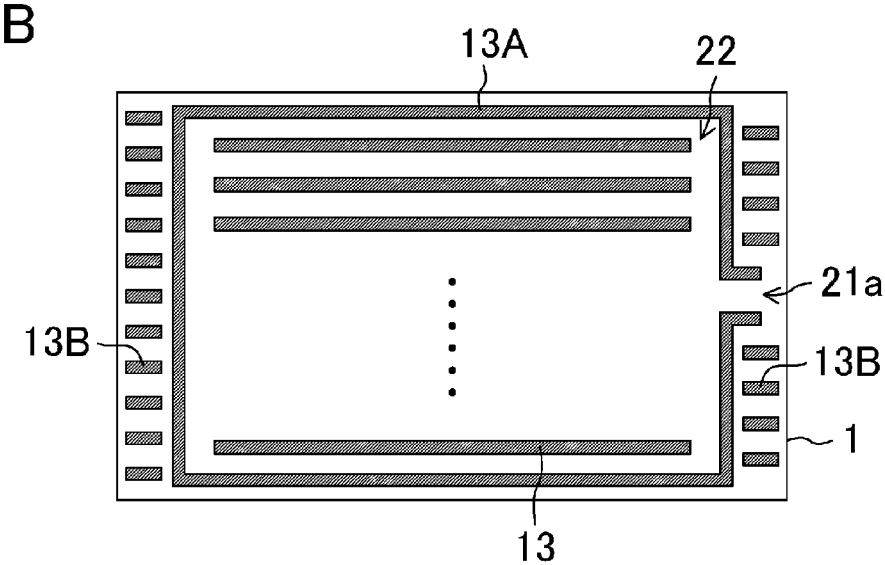

FIGS. 20A-20B show specific examples. In FIGS. 20A-20B, reference character "13B" represents a dummy spacer. A groove-like air outlet 21*a* is provided at one position in the outer peripheral spacer 13A in order to facilitate sealing. In FIG. 20A, dummy spacers 13B having substantially the same form as that of the air outlet 21*a* are provided in a line symmetrical manner. In FIG. 20B, a multiplicity of dummy spacers 13B, 13B, . . . are arranged in a line symmetrical manner in the periphery of the asymmetrical portion of the outer peripheral spacer 13A. Arranging the multiplicity of dummy spacers 13B, 13B, . . . in the line symmetrical manner reduces the influence of the asymmetrical shape of the outer peripheral spacer 13A, whereby the overall symmetry of the element substrate 1 can be ensured.

Thus, even if the outer peripheral spacer 13A has an asymmetrical shape, symmetry can be ensured by providing the dummy spacers 13B, whereby both uniformity and convenience can be obtained.

The organic EL element formed by this manufacturing method can be formed to have an excellent structure that improves its characteristics.

Specifically, the "spacers 13 are provided on the element substrate 1, and an equal-thickness layer having substantially the same thickness both on the element substrate 1 and on the spacers 13 is included in the organic layer 4." As used herein, the expression "substantially the same" means that the average thickness on the spacers 13 is, e.g., 0.5 to 1.0 times as large as that on the element substrate 1.

The spacers are typically formed on the element substrate in order to maintain a constant distance between the element substrate and a mask by the spacers when patterning the light emitting layer in a mask deposition method, or in order to prevent color mixture from being caused by the spacers during patterning in an IJ method.

Figure 21:
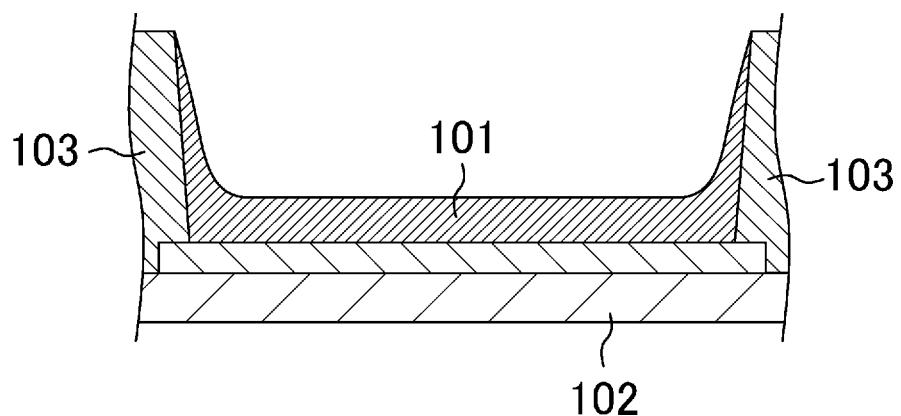
FIG. 21 is a schematic cross-sectional view of a conventional organic EL element.

As shown in FIG. 21, an organic film 101 formed by these methods has a smaller thickness on the spacers 103 than on the element substrate 102. That is, the stacking material that is injected by the IJ method has directionality, and the TS distance is long in the vacuum deposition method, whereby the sublimated stacking material flies with directionality. Thus, almost no layer is formed on the spacers 103.

In such a case, leakage tends to occur between the anode and the cathode, which may reduce luminous efficiency.

Figure 22:
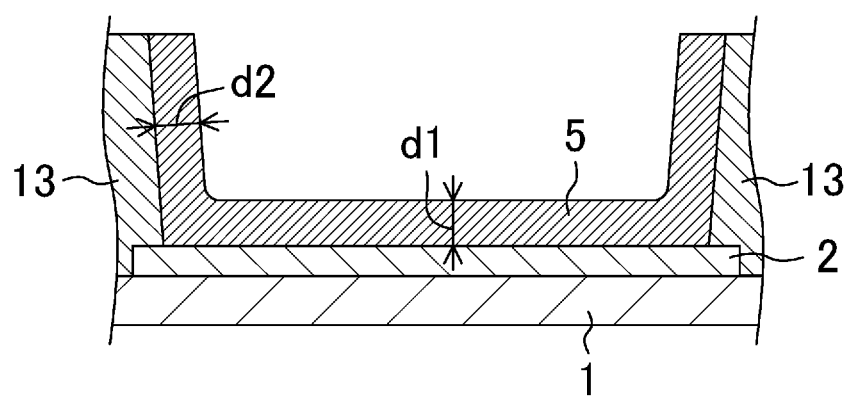
FIG. 22 is a schematic cross-sectional view of the organic EL element of the embodiment.

On the other hand, according to this manufacturing method, the stacking material flies with no directionality in the small space surrounded by the spacers 13, the element substrate 1, and the transfer substrate 12. Thus, as shown in FIG. 22, a layer (the equal-thickness layer) is formed whose thickness d1 on the element substrate 1 and thickness d2 on the spacers 13 are substantially the same. Accordingly, leakage is less likely to occur, whereby an element structure having high luminous efficiency can be formed.

Moreover, reliability of the organic EL element can be improved. That is, a planarizing layer etc. that is provided on the spacers 13 and the element substrate 1 is often comprised of a resin. In this case, water or gas is generated. If such water etc. enters the light emitting layer, quality is reduced, and reliability is reduced.

Accordingly, entrance of water etc. can be effectively prevented if a layer is formed which has substantially the same thickness both on the element substrate 1 and on the spacers 13.

It is preferable that "in the case where a display device is configured by the organic EL element manufactured by this manufacturing method, an active matrix drive is used in the display device." In the case where a display device (an organic EL display device) capable of displaying a color image or a moving picture is configured by using an organic EL element, a passive matrix drive or an active matrix drive is typically used in the drive device.

In the passive matrix drive, light is emitted from only one selected pixel. Thus, the light emission time is a frame period (normally 1/60 seconds) divided by the number of pixels. Thus, as the number of pixels is increased for higher definition, the light emission time per pixel is reduced accordingly. Thus, in order to obtain bright, high definition display, a current having a high current density need be momentarily applied in order to increase luminance per pixel. On the other hand, in the active matrix drive, only a current having a low current density need be applied because the light emission time can be controlled by a semiconductor element.

Depending on the kind of stacking material, application of a current having a high current density may result in reduction in luminous efficiency, formation of a leakage path, reduction in quality associated with an increase in temperature, etc. Thus, the active matrix drive is preferably used in high performance display devices.

In this case, high quality high performance display devices can be implemented by forming a light emitting layer, a charge transport layer, etc. by this manufacturing method.

The "stacking material may be comprised of a light emitting material that forms the light emitting layer." In this case, "in the transfer substrate fabrication step, multiple ones of the film-forming solution may be used, and the multiple ones of the film-forming solution may contain the light emitting material with different emission wavelengths, respectively." Thus, "the transfer layer may be patterned on multiple ones of the donor substrate by using the multiple ones of the film-forming solution, respectively, thereby fabricating multiple ones of the transfer substrate. The transfer substrate fabrication step, the opposing arrangement step, the depressurization step, and the transfer step may be repeatedly performed by using each of the multiple ones of the transfer substrate."

Figure 23A:
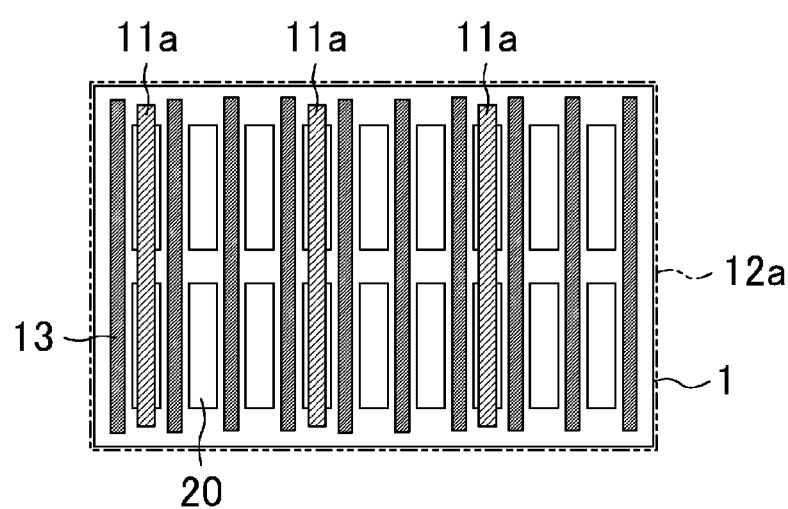
FIGS. 23A-23C are schematic plan views showing arrangements of transfer layers on separate transfer substrates, respectively.
Figure 23B:
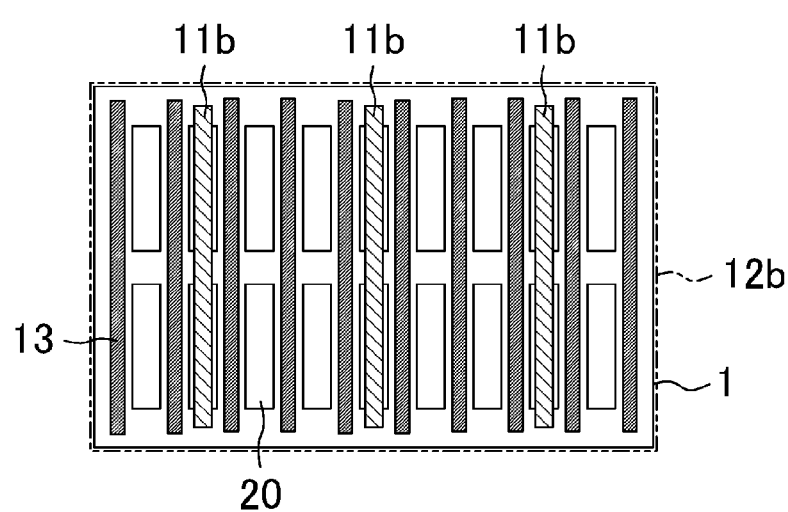
Figure 23C:
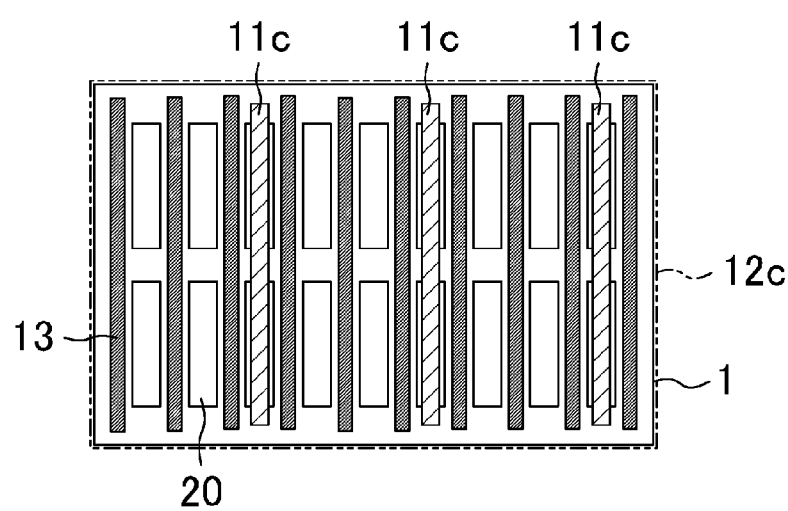

FIGS. 23A-23C show a specific example. In this example, light emitting layers of three colors, namely red (R), green (G), and blue (B), are formed as light emitting layers for color display displays. In the figures, reference character "12a" represents a transfer substrate for the red-light emitting layer, reference character "12b" represents a transfer substrate for the green-light emitting layer, and reference character "12c" represents a transfer substrate for the blue-light emitting layer. Reference characters "11a" to "11c" represent transfer layers of the three colors formed on the transfer substrates 12a to 12c, respectively. In the figures, these components are shown together with the element substrate 1 in order to facilitate understanding of the arrangement.

Thus, the transfer substrates 12a-12c are respectively fabricated for different light emission materials, and transfer to the element substrate 1 is repeatedly performed by using the transfer substrates 12a-12c, whereby the light emitting layer of each color can be formed on a desired area of the element substrate 1.

In this case, disadvantages such as misalignment and color mixture can be prevented by using a configuration that heats only the region where the transform layer 11 is formed, as described above. Since it takes only a short time to perform a series of repeated treatments, productivity is not significantly reduced.

"In the transfer substrate fabrication step, multiple ones of the film-forming solution may be patterned on different areas of the single donor substrate 10, and the opposing arrangement step, the depressurization step, and the transfer step may be performed once by using the single donor substrate 10."

Figure 24:
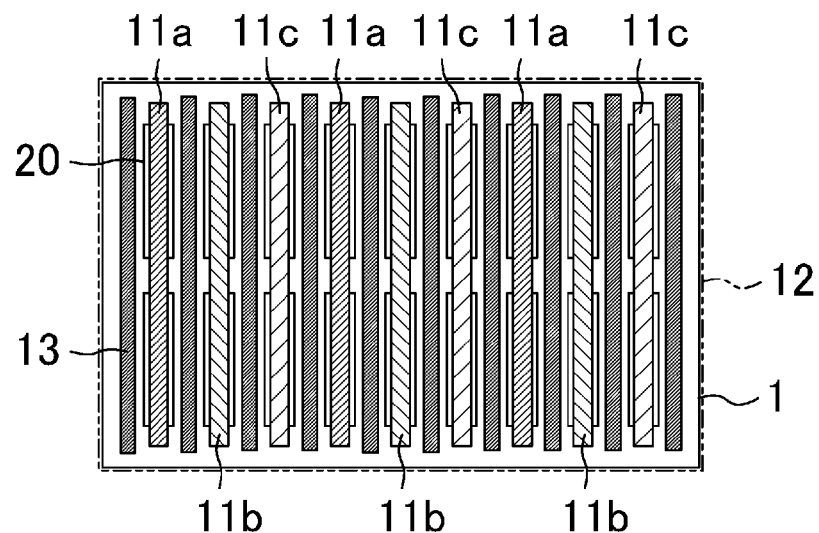
FIG. 24 is a schematic plan view showing an arrangement of transfer layers.

FIG. 24 shows a specific example. As shown in the figure, a single transfer substrate 12 is used in this example. The transfer layers 11a-11c of the three colors have been patterned to predetermined different areas of the transfer substrate 12. Thus, with this transfer substrate 12, the treatments such as the transfer treatment need be performed only once. This configuration is advantageous in terms of cost as well, because it is not necessary to provide a plurality of transfer substrates 12.

The "stacking material may be comprised of a charge action material that forms a charge action layer." The "charge action layer" as used herein includes at least one of the charge injection layer and the charge transport layer. The term "charge" means holes or electrons.

In this case, it is preferable that "at least two layers comprised of the charge action material and having different thicknesses are formed on the plurality of pixel electrodes 20, 20 . . . ."

Light emitting materials for use in organic EL elements are organic materials. Thus, the light emitting materials themselves have broad emissions spectrums, and the color purity of the light emitting materials is not so high. Although color reproducibility of, e.g., 100% or more in National Television System Committee (NTSC) ratio is desired in many display applications, color reproducibility of only up to about 70% in NTSC ratio can be achieved by the emission spectrums of the main light emitting materials.

Each layer included in the organic layer 4 has a thickness of about 10-60 nm. The overall thickness of the organic layer 4 is typically about 100-150 nm, although the optimal thickness of the organic layer 4 varies depending on the color (RGB). Since the layer having a thickness in this range is susceptible to interference of visible light, even a slight change in thickness greatly changes the color reproducibility of the organic layer 4 (microcavity effect). In other words, color purity can be improved by adjusting the thickness of the organic layer 4.

The optical thickness of the sub pixels varies depending on the color (RGB). Thus, in this manufacturing method, color purity of each color can be improved by adjusting the thickness of the electron transport layer 44 etc. for the sub-pixels of each color.

Specifically, this adjustment can be performed in a manner similar to that of the light emitting layer 43. "In the transfer substrate fabrication step, multiple ones of the donor substrate 10 may be used, and the transfer layer 11 may be patterned with different thicknesses on the multiple ones of the donor substrate 10, respectively, thereby fabricating multiple ones of the transfer substrate 12, and the transfer substrate fabrication step, the opposing arrangement step, the depressurization step, and the transfer step may be repeatedly performed on each of the multiple ones of the transfer substrate 12."

In this case, the sub-pixels of RGB are made to have different thicknesses. Although the thickness of only one of the layers in the organic layer 4 need be varied among the sub-pixels of RGB, the thickness of two or more of the layers in the organic layer 4 may be varied among the sub-pixels of RGB.

"In the transfer substrate fabrication step, multiple ones of the transfer layer 11 having different thicknesses may be patterned on different areas of the single donor substrate 10, and the opposing arrangement step, the depressurization step, and the transfer step may be performed once by using the single donor substrate 10."

Moreover, "at least two layers, which are comprised of different kinds of the stacking material from each other, may be formed on the plurality of pixel electrodes 20."

In order to display a color image, each pixel is typically divided into three sub-pixels. Materials having different emission wavelengths are used for these three sub-pixels. Since such materials having different emission wavelengths have different bandgaps and different molecular structures, an optimal charge transport material is often different depending on the material. However, it is difficult to perform patterning by the sub-pixels. Thus, regarding the layers other than the light emitting layer, the same material is typically formed on the entire surface.

On the other hand, in this manufacturing method, patterning can be performed with short cycle time and at low cost. Thus, a charge action material that is most suitable for the light emitting material of each sub-pixel can be used. This can improve element characteristics, whereby higher efficiency, longer life, etc. can be achieved.

The "film-forming treatment may be performed by using an electrospray method in which an electric field is formed between a spray nozzle and the element substrate 1 having the lower electrode formed thereon, and in this state, the film-forming solution that has been electrically charged is sprayed from the spray nozzle toward the element substrate 1."

Figure 39:
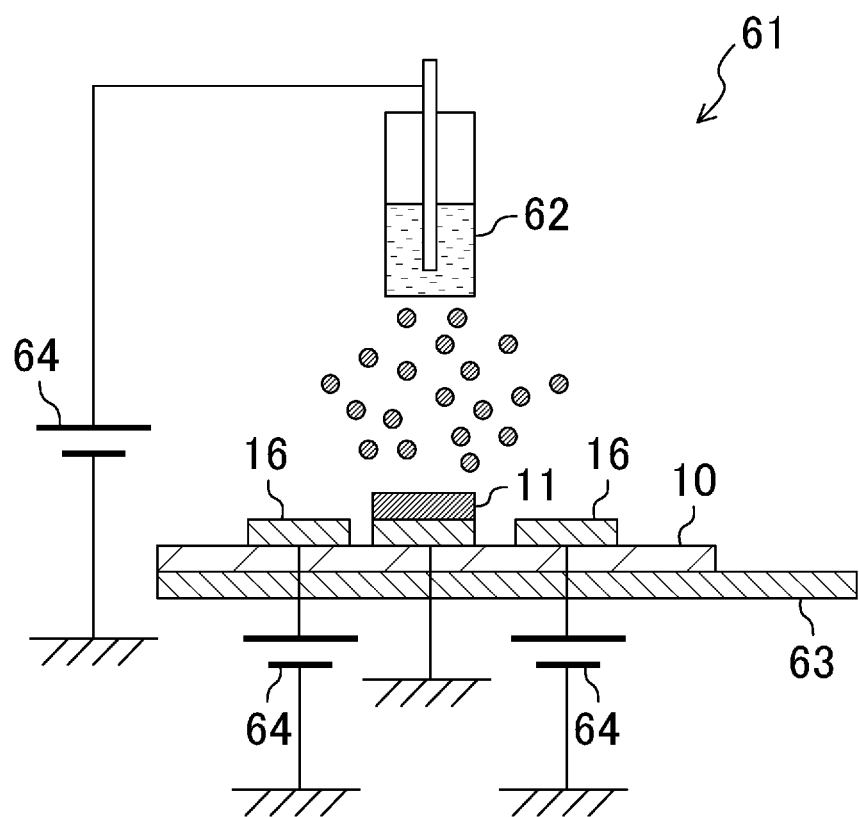
FIG. 39 is a conceptual diagram of a film-forming treatment by an electrospray method in a ninth example.

The electrospray method is generally a method in which droplets that are sprayed are electrically charged, and are divided into smaller droplets by using the action of an electric field, and these smaller droplets are caused to adhere to a target (see FIG. 39). Examples of a method for electrically charging the droplets include a method in which a film-forming solution is electrically charged before spraying, and a method in which droplets that have been sprayed are electrically charged. The charged droplets are directed to an oppositely charged target (the lower electrode) due to the action of the electric field. Thus, the droplets can be directed to a predetermined target to form a film thereon. The charged droplets repel each other, and change into fine particles. Thus, very fine particles having a particle size of several tens of nanometers etc. can be sprayed as compared to normal spray injection or an IJ method. Since the droplets change into fine particles, the surface area is increased, and the fine particles become easily dry, whereby the drying treatment can be reduced.

Thus, accurate patterning can be easily implemented by using the electrospray method, and reduction in manufacturing cost can be expected.

Alternatively, "a mask spray method may be used. Specifically, a mask is attached to the donor substrate 10, and the film-forming solution is sprayed through the mask."

Figure 25:
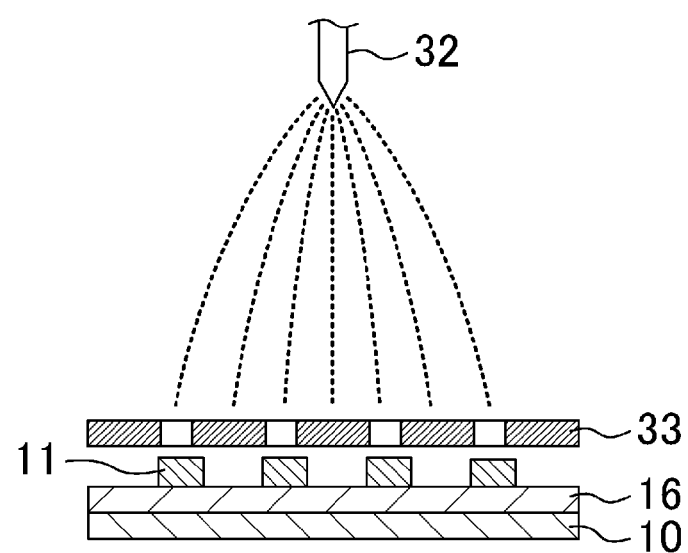
FIG. 25 is a conceptual diagram illustrating a film-forming treatment (A mask spray method).

FIG. 25 shows a specific example. In the figure, reference character "32" represents a spray configured to spray the film-forming solution, and reference character "33" represents a mask. As shown in the figure, a mask having an opening formed so as to correspond to a desired patterning shape is placed over the donor substrate 10. Then, the film-forming solution is sprayed from a spray 32 to the mask 33, whereby a film (the transfer film 11) is formed only in a region where the opening is formed on the donor substrate 10.

Such a mask spray method has the following advantage over a mask deposition method. The mask deposition method is normally performed with the side of the mask facing downward (upward deposition). Thus, a misalignment tends to occur due to the mask becoming slack etc. However, the mask spray method is performed with the side of the mask 33 facing upward (downward deposition). Thus, the mask 33 closely contacts the donor substrate 10, and a misalignment is less likely to occur. Moreover, the mask deposition method is performed under vacuum conditions, whereas the mask spray method is performed under atmospheric pressure conditions. Thus, the mask spray method is highly productive.

Moreover, "the film-forming treatment may be performed by providing a surface of the donor substrate 10 with liquid repellency, and then causing droplets 35 of the film-forming solution to adhere to a predetermined area of the surface of the donor substrate 10." In that case, it is particularly preferable that "the film-forming treatment be performed by using an inkjet method."

Figure 26A:
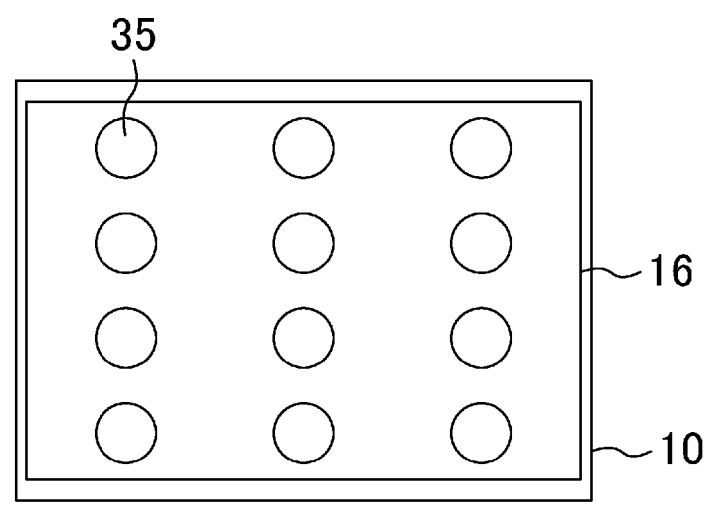
FIGS. 26A-26B are conceptual diagrams illustrating a film-forming treatment, where
Figure 26B:
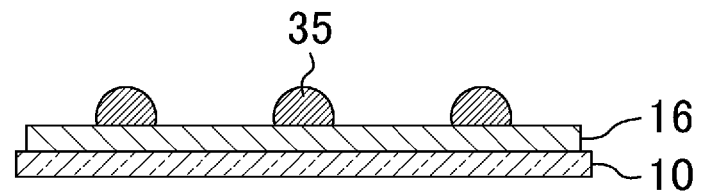

FIGS. 26A-26B show a specific example. In this example, a glass substrate is used as the donor substrate 10, and the heat generating layer 16 is comprised of molybdenum (Mo). The heat generating layer 16 has been subjected to a surface treatment to have liquid repellency to the film-forming solution. Droplets 35, 35, . . . of the film-forming solution are directed to predetermined positions and patterned on the heat generating layer 16 by an inkjet method. The droplets 35 thus dropped have a dome shape due to the liquid repellency, and a dot-shaped film (the transfer layer 11) is formed. Since the dot-shaped film need only be formed on a predetermined area of the donor substrate 10, a complex surface treatment such as providing a bank is not required. The shape of the film (the transfer layer 11) is not limited to the dot shape. The shape of the film (the transfer layer 11) may be a linear shape etc., and can be selected as required.

Alternatively, "the film-forming treatment may be performed by performing a treatment of increasing a lyophilic property of a predetermined area of the donor substrate 10 relative to a remaining area thereof, and then causing the film-forming solution to adhere to the donor substrate 10.

Specifically, first, the predetermined area where a film is to be formed is provided with the lyophilic property, or the area other than the predetermined area is provided with liquid repellency. For example, the predetermined area can be provided with the lyophilic property etc. by a method in which a lyophilic or liquid repellent material is patterned on the donor substrate 10, a method in which wettability of the donor substrate 10 is modified by light irradiation, a method in which an ultra-liquid repelling phenomenon is cause to occur by improvement of the surface structure (nanostructure), etc.

Then, a film is formed over the entire surface of the donor substrate 10 provided with the lyophilic property etc. by using a convenient method such as a spin coating method or a dipping method. Thereafter, a drying treatment is performed, whereby the film can be formed only on the predetermined area. According to this method, operation is simplified, whereby lower cost and shorter cycle time can be implemented.

EXAMPLES

Specific examples (first to fourteenth examples) will be described below.

First Example

<Structure of Organic EL Element>

Figure 27:
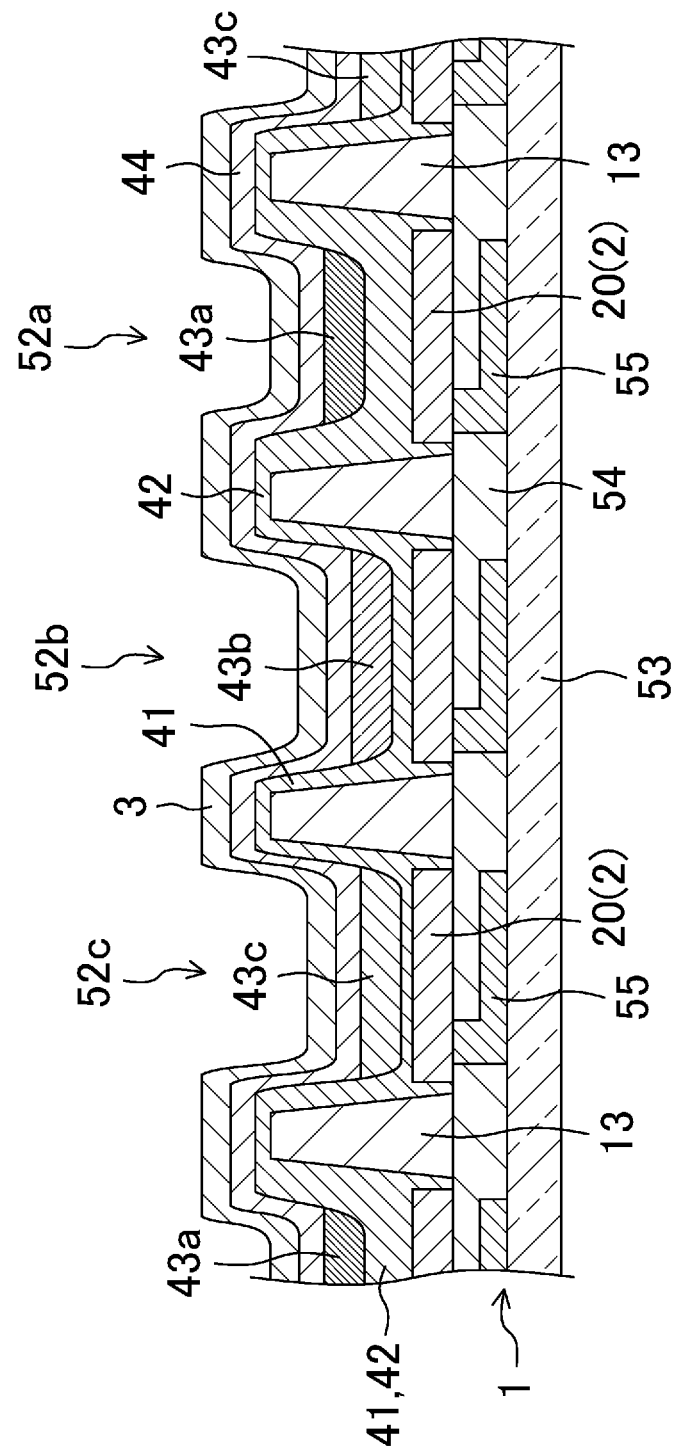
FIG. 27 is a schematic cross-sectional view of an organic EL element in a first example.
Figure 28A:
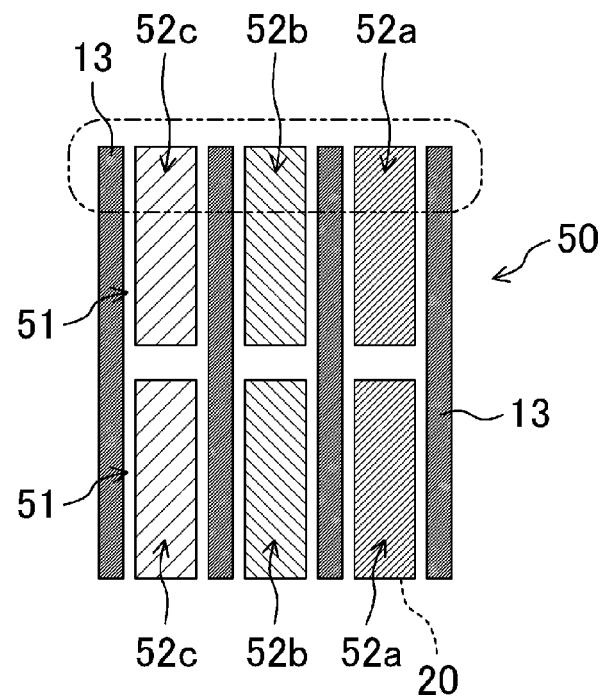
FIGS. 28A-28B are schematic plan views showing a part of the organic EL element in the first example, where
Figure 28B:
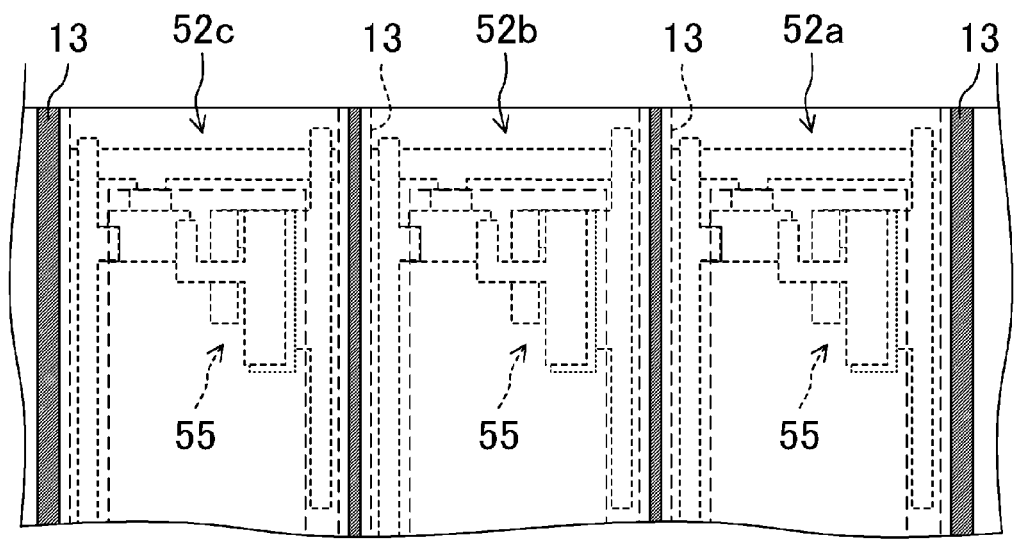

FIGS. 27 and 28A-28B show an organic EL element of this example. This organic EL element forms a display portion 50 of a color display device. The display portion 50 is formed by a group of pixels 51, 51, . . . arranged in a grid pattern. Each pixel 51 includes three sub-pixels 52, namely an R sub-pixel 52a, a G sub-pixel 52b, and a B sub-pixel 52c.

As shown in FIG. 27, in this organic EL element, an element layer 54 including thin film transistor (TFT) elements 55 is provided on a glass substrate 53, whereby an element substrate 1 is formed. A lower electrode (an anode 2) that is electrically connected to the TFT elements 55 via through holes is formed on the element layer 54. The anode 2 is comprised of AL/ITO. The anode 2 is formed by a plurality of pixel electrodes 20, 20, . . . patterned in a grid shape so as to correspond to sub-pixels 52. A hole injection layer 41 and a hole transport layer 42 having a thickness of 20 nm are integrally formed on the anode 2.

The thickness of the hole injection layer 41 varies among the sub-pixels 52 of RGB so that chromaticity can be improved by light interference (microcavity effect) that is caused between the electrodes. Light emitting layers 43a-43c of RGB are patterned on the hole injection layer 41 etc. Each of the hole injection layer 41 and the light emitting layer 43 is patterned by the predetermined method described above. This will be described in detail later.

An electron transport layer 44 is formed with a thickness of 20 nm on the light emitting layer 43. An upper electrode (a cathode 3) is formed on the electron transport layer 44. The cathode 3 is comprised of LiF (1 nm)/MgAg (5 nm)/Al (3 nm). The cathode 3, the hole transport layer 42, and the electron transport layer 44 of this example are formed over the entire surface by a vacuum deposition method.

This color display device uses a reflective electrode as the anode 2, and a semi-transparent electrode as the cathode 3, and has a top emission structure in which emitted light is output from the opposite side of the glass substrate.

As shown in FIGS. 28A-28B, the pixel electrodes 20 are patterned in a rectangular shape having a size of 100 μm by 300 μm so as to correspond to the sub-pixels 52a-52c. The sub-pixels 52a-52c are separated from each other by 20 μm both in the vertical and lateral directions.

An elongated wall-shaped spacer 13 is formed in each gap between the sub-pixels 52a-52c of RGB. The spacers 13 are arranged in a stripe pattern. The spacers 13 of this example have a height of 5 μm. The spacers 13 are comprised of a photosensitive polyimide resin, and are patterned by a photolithography process. The material of the spacers 13 is not limited to the polyimide resin, and may be appropriately selected as required. For example, the spacers 13 may be comprised of an inorganic material.

The overall arrangement of the spacers 13 on the element substrate 1 is as shown in FIG. 20B. An air outlet 21a is formed so as to open at a position located 1 mm inside the edge of the element substrate 1. Although the spacers 13 were originally arranged as shown in FIG. 18, the arrangement of the spacers 13 has been improved as shown in FIG. 20B because pressure bonding was not sufficient in some cases in the original arrangement. This improved arrangement enables stable pressure bonding to be achieved.

General-purpose products are used as the TFT elements 55. As shown in FIG. 28B, in the TFT element 55 of this example, a drive circuit having two transistors and one capacitor is provided for each sub-pixel 52a-52c.

<Manufacturing Method of Organic EL Element>

FIGS. 29A-29F and 30A-30E show a manufacturing flow of the organic EL element. This manufacturing flow will be briefly described below.

As shown in FIG. 29A, an element substrate 1 is fabricated. Then, as shown in FIG. 29B, a plurality of pixel electrodes 20, 20, . . . are formed as an anode 2 on the element substrate 1. As shown in FIG. 29C, spacers 13 are patterned on the element substrate 1 (the spacer formation step). Then, hole injection layers 41 having different thicknesses are patterned as shown in FIGS. 29D-29F.

Figure 30A:
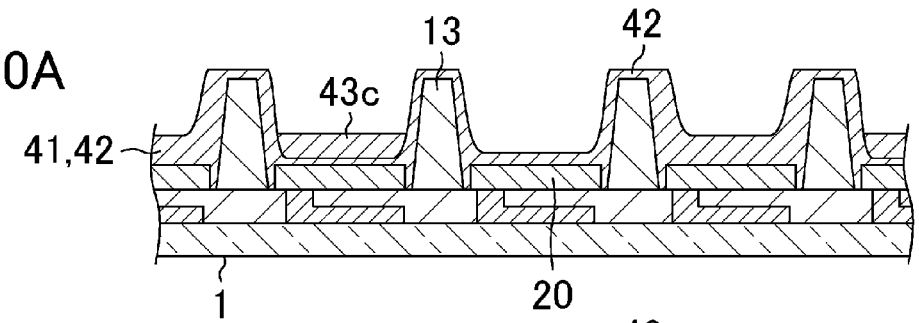
FIGS. 30A-30E are flow diagrams illustrating the manufacturing process in the first example.
Figure 30B:
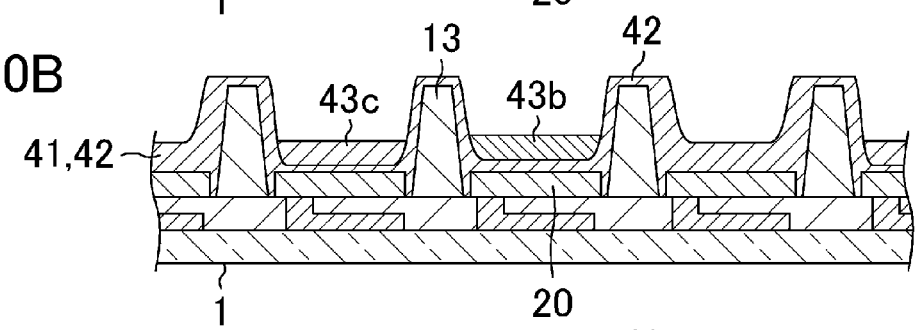
Figure 30C:
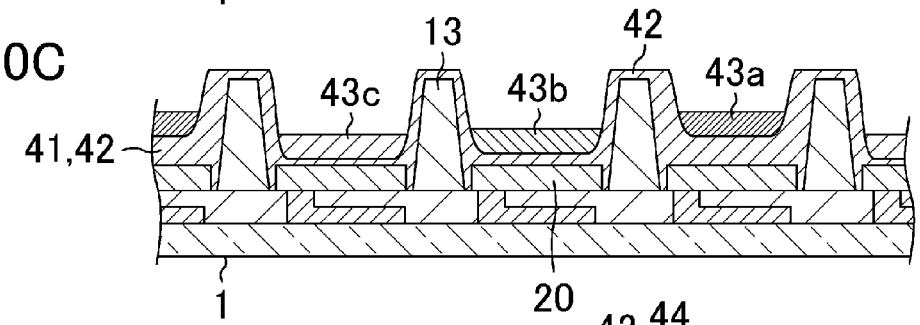
Figure 30D:
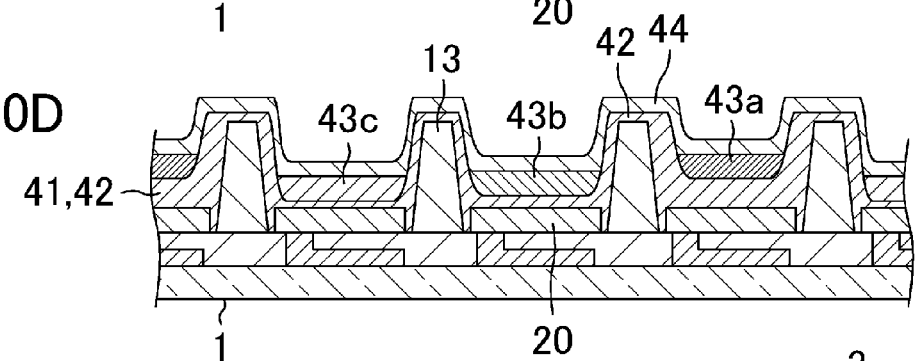
Figure 30E:
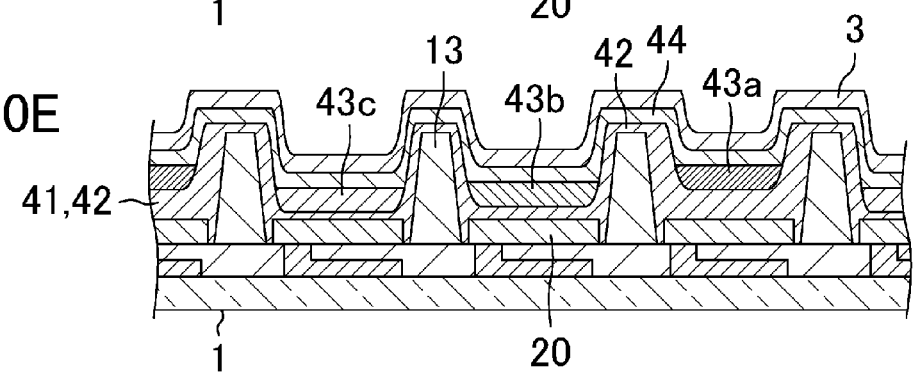

Thereafter, as shown in FIGS. 30A-30C, a hole transport layer 42 is formed over the entire surface by vapor deposition, and then light emitting layers 43a-43c of RGB are patterned. Subsequently, as shown in FIGS. 30D-30E, an electron transport layer 44 and a cathode 3 are deposited over the entire surface.

This manufacturing method will be described in detail below. Since the spacers 13, and the hole transport layer 42, the electron transport layer 44, and the cathode 3 that are formed over the entire surface can be formed by using conventional methods, detailed description thereof will be omitted.

(Formation of Hole Injection Layer 41)

A treatment of patterning the hole injection layers 41 was performed by two methods, namely a method (individual transfer) in which the hole injection layers 41 are separately patterned according to the thickness by using a plurality of transfer substrates 12, and a method (batch transfer) in which all the hole injection layers 41 are patterned at a time by using a single transfer substrate 12.

(Individual Transfer)

A glass plate that allows light emitted from a halogen lamp to pass therethrough was used as a donor substrate 10 forming a transfer substrate 12. A Mo film (a heat generating layer 16) that absorbs the emitted light was formed with a thickness of 1,000 Å on the entire surface of the glass plate by a sputtering method. The heat generating layer 16 is not limited to Mo, and may be comprised of Ti or Al. In order to provide the Mo film with liquid repellency, the surface of the Mo film was modified by a plasma treatment. The glass plate having the Mo film formed thereon was subjected to a photolithography process to pattern the Mo film into a stripe pattern. Three donor substrates 10, 10, 10 (also referred to as the "first donor substrates 10") were fabricated in this manner.

Figure 31A:
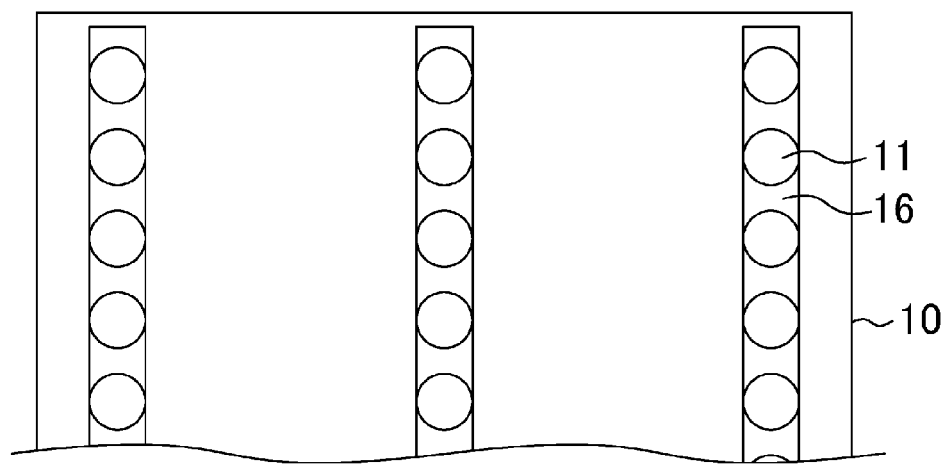
FIGS. 31A-31B are schematic diagrams showing a transfer substrate in the first example, where
Figure 31B:
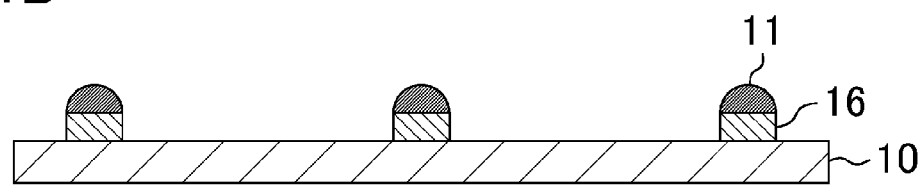

As shown in FIGS. 31A-31B, the band-shaped Mo films having a width of 120 μm are formed at intervals of 240 μm on the three first donor substrates 10, 10, 10. In these first donor substrates 10, 10, 10, the band-shaped Mo films are shifted by a predetermined width so as to correspond to the sub-pixels 52a-52c of the element substrate 1.

A low molecular compound was used as a material of the hole injection layers. The low molecular compound was dissolved in a mixed solvent of THF and xylene to produce a film-forming solution. By using this film-forming solution, transfer layers 11 were patterned on the first donor substrate 10 by a known IJ method.

First, a transfer substrate 12 (an R transfer substrate 12) for R sub-pixels was fabricated. Droplets of a coating solution were caused to adhere to the areas of the Mo films on the R transfer substrate 12 so as to form a film on each area. Thus, dot-shaped transfer layers 11 were formed on these areas. Dimensions of the transfer layers 11 were adjusted so that the dried transfer layers 11 had a diameter of 100 μm and a height of 150 nm from the Mo film. The intervals between the transfer layers 11 were adjusted to 10 μm. The R transfer substrate 12 was heated to 120° C. during the film formation. This allowed the solvent contained in the droplets to have been evaporated by the time the film formation was completed.

The film-forming solution adhering to the Mo films had a dome shape having a contact angle of substantially 90 degrees, and the dot-shaped transfer layers 11 were eventually able to be formed.

Next, a transfer substrate 12 (a G transfer substrate 12) for G sub-pixels and a transfer substrate 12 (a B transfer substrate 12) for B sub-pixels were fabricated in a manner similar to that of the R transfer substrate 12. Dimensions of the transfer layers 11 were adjusted so that the dried transfer layers 11 had a height of 70 nm from the Mo film on the G transfer substrate 12, and a height of 40 nm from the Mo film on the B transfer substrate 12. The time required for patterning was 20 sec for each substrate. The material utilization efficiency was about 85%.

A series of film-forming treatments were performed in a clean room. Dry air having a dew-point temperature of −20° C. was supplied between an ink jet head and the first donor substrate 10. The use of the dry air having a dew-point temperature of −20° C. is advantageous in terms of cost because such dry air can be easily supplied by using a common compressed air producing apparatus.

In the individual transfer, transfer is separately performed for each of the sub-pixels 52a-52c having different thicknesses. Thus, the individual transfer is advantageous especially when high accuracy is required. Although the transfer treatment need be performed three times, the time required for this is very short, and thus the overall manufacturing process is not affected.

(Batch Transfer)

A single donor substrate 10 (a second donor substrate 10) was fabricated in a manner similar to that of the individual transfer. In the second donor substrate 10, band-shaped Mo films having a width of 110 μm were formed at intervals of 10 μm.

Figure 32A:
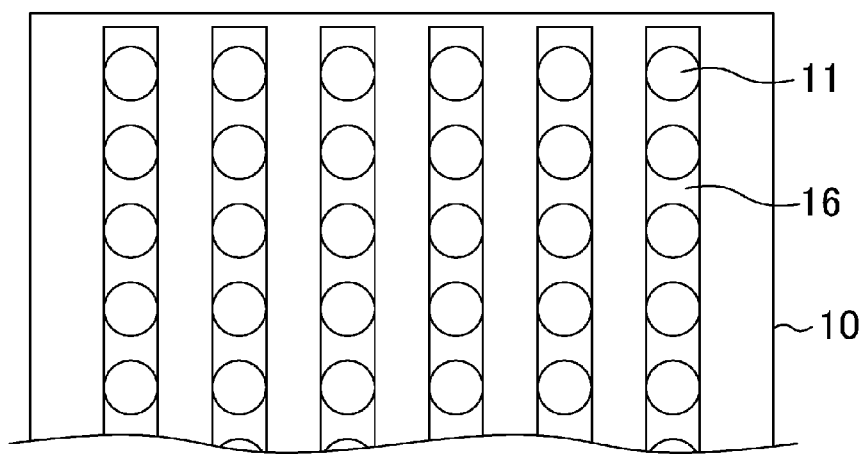
FIGS. 32A-32B are schematic diagrams showing a transfer substrate in the first example, where
Figure 32B:
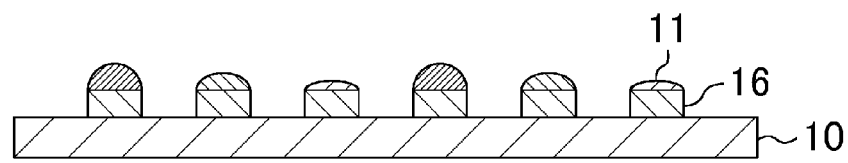

As shown in FIGS. 32A-32B, in the second donor substrate 10, dot-shaped transfer layers 11 were formed on the areas of the Mo films corresponding to the R sub-pixels 52a by causing droplets to adhere to these areas so that the dried transfer layers 11 had a height of 150 nm from the Mo film. Moreover, dot-shaped transfer layers 11 were formed on the areas of the Mo films corresponding to the G sub-pixels 52b, so that the dried transfer layers 11 had a height of 70 nm from the Mo film. Dot-shaped transfer layers 11 were also formed on the areas of the Mo films corresponding to the B sub-pixels 52c, so that the dried transfer layers 11 had a height of 40 nm from the Mo film. Dimensions of the transfer layers 11 were adjusted so that the dried transfer layers 11 had a diameter of 100 μm. The transfer substrate 12 was heated during the film formation. The time required for patterning was 30 sec. The material utilization efficiency was about 85%.

In the batch transfer, the transfer treatment need be performed only once. Thus, the number of transfer substrates 12 required is reduced. Accordingly, the batch transfer is advantageous especially when cost advantages are required.

Each transfer layer 11 thus patterned was observed by atomic force microscopy (AFM). According to the observation, the films formed were generally uniform, but agglomerates having a diameter of about 10 nm were recognized in places.

(Transfer Step etc.)

Each transfer substrate 12 thus fabricated was bonded with the element substrate 1 so that the surface of the transfer substrate 12, which had the transfer layers 11 formed thereon, faced the element substrate 1. In this state, the transfer substrate 12 and the element substrate 1 were held in a vacuum chamber 14, and a transfer treatment was performed.

The vacuum chamber 14 is configured as shown in FIG. 12 described above. In this example, the vacuum chamber 14 capable of maintaining high vacuum higher than $10^{-3}$ Pa therein was used, and the degree of vacuum was $4\times10^{-4}$ Pa. A halogen lamp was used as a heat source 15. Specifically, a surface emission halogen lamp ("UHMA1-CL1000" made by USHIO INC.) was used. The same treatment was repeated for each of the three transfer substrates 12, 12, 12 fabricated by the individual transfer.

Figure 33A:
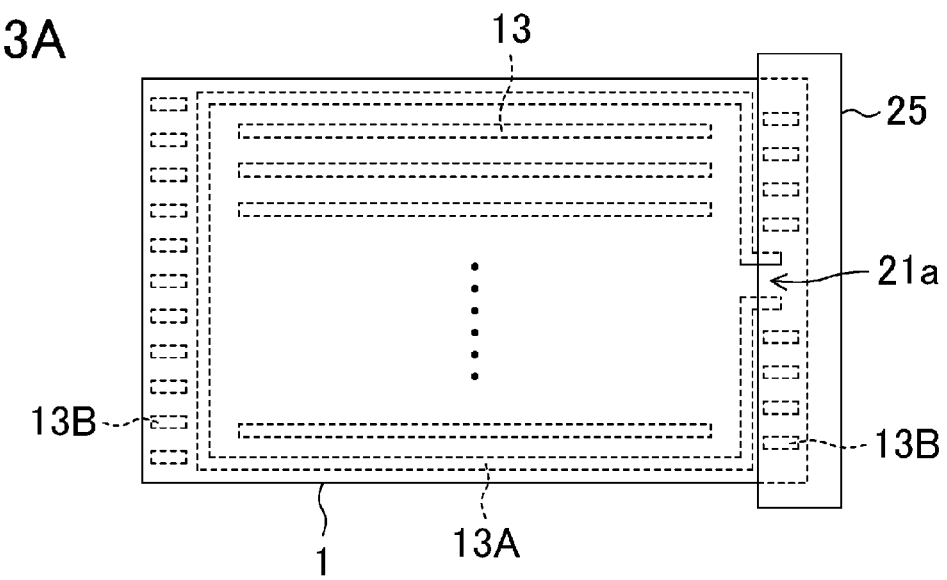
FIGS. 33A-33B are diagrams showing a transfer substrate and an element substrate that are placed so as to face each other, where
Figure 33B:
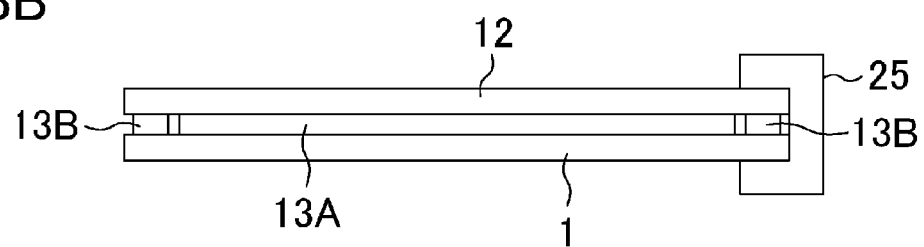

In the vacuum chamber 14, the transfer substrate 12 was bonded with the element substrate 1 so that the gap between the substrates 1, 12 was hermetically sealed. Specifically, as shown in FIGS. 33A-33B, a chuck 25 made of an elastic material such as rubber, silicon, etc. was attached to a portion where the air outlet 21a was located. Then, air was gradually removed from the vacuum chamber 14 to depressurize the vacuum chamber 14. Since the space partitioned by the spacers 13 between the substrates 1, 12 communicates with the inner space of the vacuum chamber 14 via the air outlet 21a, this space can be depressurized similarly to the vacuum chamber 14. Subsequently, the vacuum chamber 14 was depressurized to the above degree of vacuum, and then the degree of vacuum in the vacuum chamber 14 was quickly reduced. In this manner, the air outlet 21a is sealed by the chuck 25, and the pressure in the gap between the substrates 1, 12 is relatively reduced, whereby the entire surfaces of the substrates 1, 12 are uniformly brought into close contact with each other.

The substrates 1, 12 may be bonded together after placing the substrates 1, 12 in the vacuum chamber 14 and depressurizing the vacuum chamber 14 to a predetermined degree of vacuum. This is advantageous in that processing can be performed in a short time because the vacuum chamber 14 is depressurized before bonding the substrates. In either case, the substrates 1, 12 closely contact each other due to the difference in pressure, whereby a uniform small gap (corresponding to the TS distance) can be maintained between the entire surfaces of the transfer substrate 12 and the element substrate 1.

The substrates positioned in place were irradiated with the halogen lamp from the side of the transfer substrate 12. The halogen lamp was heated until the surface temperature of the transfer substrate 12 reached 300° C. (10 sec). Since high vacuum is maintained in the vacuum chamber 14, the transfer layers 11 are sublimated and fly, thereby forming films over the element substrate 1. The entire transfer layers 11 were transferred to the element substrate 1.

Specifically, films having a thickness of 140 nm were formed over the element substrate 1 from the transfer layers 11 corresponding to the R sub-pixels 52a. Films having a thickness of 60 nm were formed over the element substrate 1 from the transfer layers 11 corresponding to the G sub-pixels 52b. Films having a thickness of 30 nm were formed over the element substrate 1 from the transfer layers 11 corresponding to the B sub-pixels 52c.

As shown in FIG. 22, each of the films was formed over the element substrate 1 and the spacers 13, and the films had substantially the same thickness. Since the films are thus evenly formed over the element substrate 1, leakage between the electrodes 2, 3 can be effectively prevented. Furthermore, since the transfer layers 11 can be entirely transferred, the material utilization efficiency can be significantly improved.

The films formed by the transfer were observed by AFM. According to the observation, the agglomerates recognized in the transfer layers 11 were not present in the films, and the films had a uniform structure.

(Formation of Light Emitting Layer 43)

A mixture of a host material and a guest material was used as a light emitting material. In this example, pigments of Ir complexes that emit light of RGB, respectively, were used as guest materials. These guest materials were dissolved in mixed solvents of NMP and THF to produce coating solutions for the sub-pixels of RGB, respectively. The mixing ratio of each guest material to the host material was about 5 wt %.

For the light emitting layer 43 as well, transfer substrates 12 were fabricated by using both an individual transfer method and a batch transfer method as in the case of the hole injection layer 41. It should be noted that the thickness of the transfer layers 11 was adjusted to 30 nm. The time required for patterning was 45 sec. The material utilization efficiency was about 85%.

A series of treatments and conditions in the subsequent transfer step etc. are similar to those of the hole injection layer 41 except that the time required for heating (to 300° C.) was 5 sec. As a result, predetermined light emitting layers 43a-43c each having a thickness of 20 nm were able to be formed in the sub-pixels 52a-52c of RGB on the element substrate 1, respectively.

In the batch transfer, adhesion of a small amount of light emitting material was recognized between the sub-pixels 52a-52c of RGB although the level of adhesion was not so high as to affect light emitting characteristics. Thus, the individual transfer capable of preventing such adhesion is preferably used for display devices for which high definition is required.

(Characteristics of Organic EL Element)

Characteristics of the organic EL element thus fabricated were examined.

First, a normal organic EL element and the organic EL element of this example were compared with respect to the NTSC ratio of white display. As a result, the NTSC ratio of the normal organic EL element was 62% where R (0.67, 0.33), G (0.30, 0.63), and B (0.15, 0.18), while the NTSC ratio of the organic EL element of this example was 101% where R (0.68, 0.33), G (0.18, 0.74), and B (0.13, 0.07).

In addition, organic EL elements were fabricated under the same conditions except that a vacuum deposition method and a mask deposition method were used (comparative examples). An organic EL element (a first comparative example) having spacers formed in a manner similar to that of the example, and an organic EL element (a second comparative example) having no spacers were fabricated as the comparative examples. Characteristics of these comparative examples were compared with those of the organic EL element of this example.

The result showed that no leakage current was recognized in the example and the second comparative example, and the characteristics of the organic EL elements of the example and the second comparative example were about the same, whereas a leakage current was recognized in the first comparative example. The luminous efficiency also decreased by about 20% and light emission was not stable in the first comparative example. It seems that in the first comparative example, leakage occurred at the edge portions of the spacers.

Second Example

This example is similar to the first example except that a heat source configured to emit pulsed radiation of thermal energy was used as the heat source 15. Thus, differences between this example and the first example will be described in detail below.

A xenon flash anneal lamp capable of emitting pulsed radiation was used as the heat source 15. This xenon lamp is a modified product of a lamp made by USHIO INC. Light emitted from this xenon lamp is white light having a wavelength of 200 to 1,100 nm with peak intensity at 450 to 500 nm. The irradiation time can be controlled in the range of 1 msec or less. In this example, irradiation was controlled so that the surface temperature of the transfer substrate 12 reached 300° C. by irradiation for 1 msec.

The heat generating layer 16 was comprised of titanium (Ti). Ti is preferable as the heat generating layer 16 for xenon lamps, because Ti absorbs more visible light than other metals.

Thus, using the pulsed irradiation of thermal energy can limit the heated portion to the surface. Continuous irradiation may heat an unnecessary portion because thermal energy is transmitted deep into the film or the substrate. As a result, only the transfer layers 11 were able to be intensively heated.

Since white light having a predetermined wavelength was emitted, the heat generating layer 16 was able to be intensively heated. This is because glass and metals reflect white light. The halogen lamp of the first example heats glass etc. as well because it emits infrared light.

In the first example, the time to cool the element substrate 1 was required after the transfer treatment because the temperature of the element substrate 1 increased by the transfer treatment. In this example, however, the temperature of the element substrate 1 was almost the same even immediately after the transfer step. Thus, quick continuous transfer can be performed, whereby the cycle time can be reduced.

Moreover, the drive threshold voltage of the TFTs was reduced by 0.1 V as compared to the first example. This seems to be because, as compared to continuous irradiation of the halogen lamp, an adverse effect on the TFT elements was reduced and characteristics were improved.

A surface emission pulsed laser may be used as the heat source 15 configured to emit pulsed radiation. Pulsed radiation may be mechanically provided by using a shutter etc. capable of opening and closing in a pulsed manner a halogen lamp or a surface emission laser that emit continuous radiation.

Third Example

In this example, a titanium film having a thickness of 100 μm was used as the donor substrate 10. This example is otherwise similar to the second example.

Using the titanium film as the donor substrate 10 can simplify the manufacturing process because a titanium film need not be formed on a glass plate. Moreover, the cost can be reduced because no glass plate is used.

Figure 34:
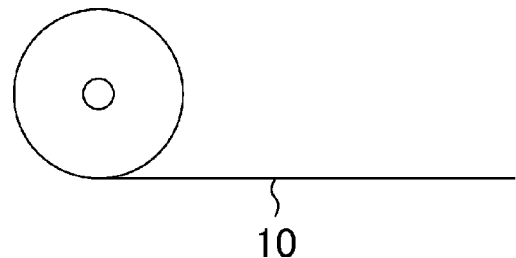
FIG. 34 is an illustration of a third example.

As shown in FIG. 34, since the titanium film can be supplied in the form of a roll, the titanium film can be applied to a roll-to-roll continuous manufacturing process. Thus, further reduction in cycle time can be expected.

Fourth Example

In this example, a titanium film having a heating preventing layer 17 formed thereon was used as the donor substrate 10. This example is otherwise similar to the third example. The heating preventing film 17 was comprised of, e.g., a material such as $SiN_x$ etc., and was formed by patterning with a thickness of 100 nm on a predetermined area of the titanium film. The heating preventing layer 17 may be comprised of an inorganic material, an organic resin, etc.

Figure 35A:
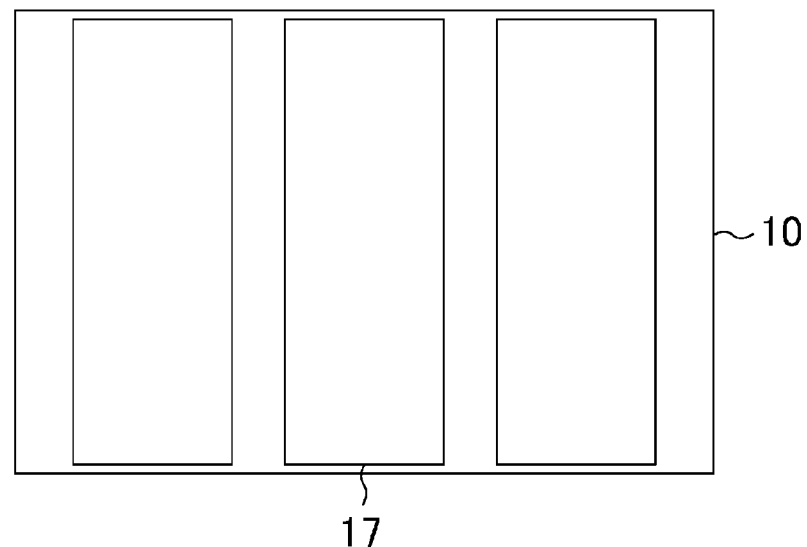
FIGS. 35A-35B are schematic diagram showing a donor substrate in a fourth example, where
Figure 35B:
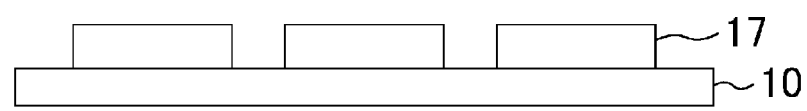

FIGS. 35A-35B show the donor substrate 10 of this example. This donor substrate 10 corresponds to the first donor substrate 10 in the first example. The heating preventing layer 17 is provided in a portion other than predetermined areas where the transfer layers 11 are to be formed.

Figure 36:
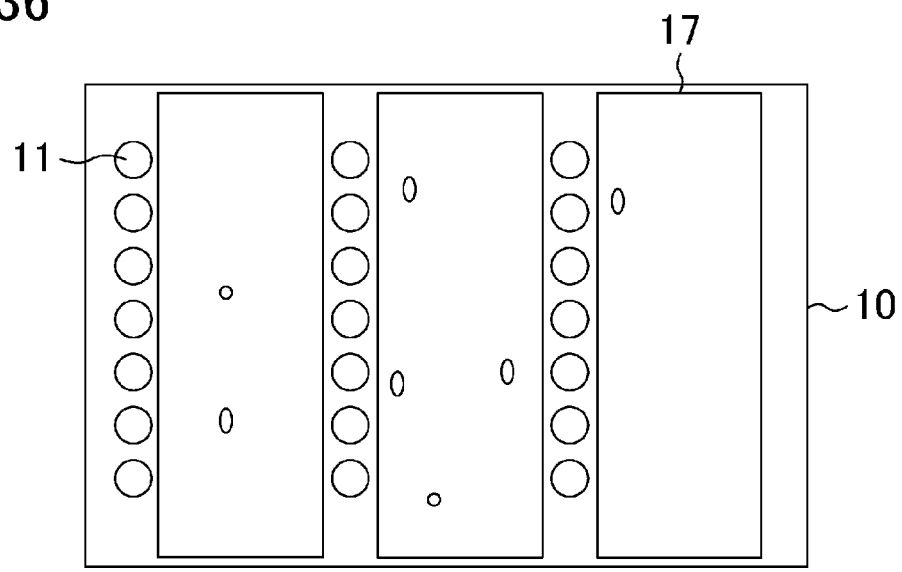
FIG. 36 is a diagram corresponding to FIG. 35A, illustrating occurrence of color mixture in the fourth example.

As shown in FIG. 36, when patterning the transfer layers 11 on the donor substrate 10, a film-forming solution may adhere to an undesirable area. In this case, if the donor substrate 10 is comprised only of the titanium film, the entire donor substrate 10 is heated, and thus the film-forming solution that has excessively adhered to the donor substrate 10 is also transferred. This may cause color mixture when forming the light emitting layer.

Thus, the heating preventing layer 17 is provided in the area where the transfer layers 11 are not to be formed, so that the film-forming solution that has excessively adhered to the donor substrate 10 is not heated. This allows only the transfer layers 11 to be transferred, whereby color mixture etc. can be prevented.

Fifth Example

In this example, the spacers 13 are provided on the donor spacer 10 instead of the element substrate 1. This example is otherwise similar to the first example.

In this example, no spacers 13 are provided on the element substrate 1. Thus, this example is advantageous in that the area of each sub-pixel 52 can be increased accordingly, and that the aperture ratio can be increased. In the case where the spacers 13 are provided on the element substrate 1, the spacers 13 need be provided on all the element substrates 1.

However, there is no such need in this example, whereby the material cost and the facility cost can be reduced. Thus, this example is also advantageous in terms of cost.

Sixth Example

In this example, the spacers 13 were comprised of a material that absorbs thermal energy emitted from the heat source 15. This example is otherwise similar to the second example. Specifically, the spacers 13 were comprised of titanium.

As shown in FIG. 6 described above, a group of band-shaped titanium films arranged in a stripe pattern were patterned with a thickness of 3 μm on the element substrate 1, and then groove-like recesses 18 were formed in the upper ends of the titanium films. The spacers 13 having a U-shaped cross section were formed in this manner.

In this example, the spacers 13 function also as the heat generating layer 16, the cost for members can be reduced. Since the contact area between the heat generating layer 16 and the transfer layer 11 can be increased, the transfer layers 11 can be efficiently transferred.

Seventh Example

In this example, the spacers 13 were formed so as to surround the pixel electrodes 20. This example is otherwise similar to the first example.

Figure 37:
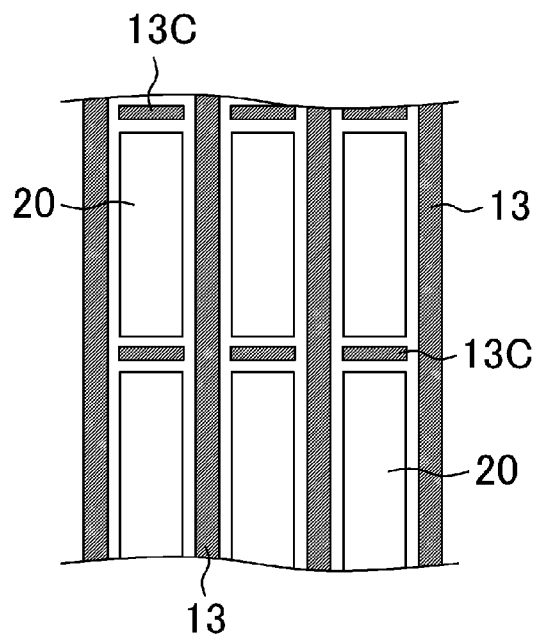
FIG. 37 is a schematic plan view showing a seventh example.

Specifically, as shown in FIG. 37, auxiliary spacers 13C having a width of 10 μm and a height of 5 μm were further provided between ends of the shorter sides of the pixel electrodes 20 forming the sub-pixels 52a-52c of RGB.

When forming the light-emitting layer 43 on the element substrate 1 having the spacers 13 arranged in this manner, the treatment was performed so that two dot-shaped transfer layers 11 were formed on each sub-pixel 52a-52c.

Since the sub-pixels 52a-52c are separated from each other by the spacers 13, the area where the transfer layer 11 diffuses is divided into small areas, whereby unevenness of the film thickness at the time of transfer can be reduced.

Eighth Example

This example is different from the first example in that a small droplet spray method was used as a film-forming treatment. Although the donor substrate 10 was heated in the film-forming treatment in the first example, the donor substrate 10 is not heated in this example. Since there was no possibility of thermal degradation, a film was formed under the atmospheric pressure. In this example, the transfer layers 11 for the light emitting layer was patterned by using the second donor substrate 10. The film thickness was adjusted so that the dried transfer layers 11 had a thickness of 30 nm.

Figure 38:
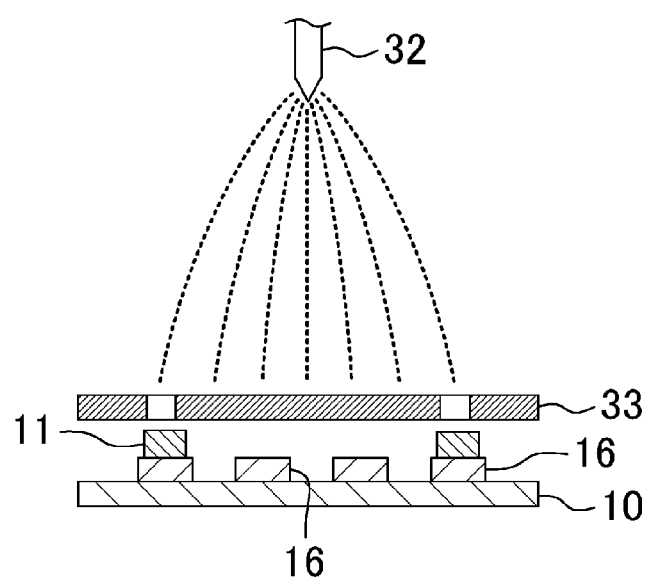
FIG. 38 is a conceptual diagram of a film-forming treatment by a mask spray method in an eighth example.

In this example, the film-forming treatment was performed by the following two small droplet spray methods, namely first and second small droplet spray methods. The second small droplet spray method corresponds to a mask spray method.
<First Small Droplet Spray Method>
A M3D aerosol jet system made by Optomec, Inc. was used as a spraying apparatus. A film-forming solution was injected from a small nozzle of the system, and the film-forming solution in the form of an aerosol was directly patterned on the donor substrate 10.
<Second Small Droplet Spray Method>
As shown in FIG. 38, patterning was performed on the second donor substrate 10 by spraying a film-forming solution by a spray 32 via a mask 33 having predetermined openings formed in the same pattern as that of the Mo films. A general-purpose spray apparatus can be used as the spraying apparatus. STS-200 made by Produce Co., Ltd. was used in this example. Since this method is of a downward deposition type, this method is advantageous over a vacuum deposition method of an upward deposition type in that the mask can closely contact the donor substrate 10 due to the weight of the mask itself.

In either method, the distance between an injection head and the donor substrate 10 was controlled so that sprayed droplets had been almost dried at the time the droplets reached the donor substrate 10. The film thus formed had a structure in which fine particles having a particle size of about 1 μm were continuously bonded together.

The light emitting layer 43 was formed over the element substrate 1 by performing a treatment in a manner similar to that of the first example by using the transfer substrate 12 thus obtained. The light emitting layer 43 thus formed had a uniform structure with no particle-like structure recognized therein. Degradation in characteristics due to water etc. was not recognized, either. Moreover, in this example, the time required for transfer was reduced by 20% as compared to the first example. This seems to be because the transfer layers 11 having the structure in which fine particles are continuously bonded together has a larger surface area and thus can be more easily heated, as compared to the transfer layers 11 having a uniform structure. Thus, reduction in cycle time can be implemented by using such a small droplet spray method as the film-forming treatment.

Ninth Example

This example is different from the first example in that an electrospray method was used as a film-forming treatment.

In the electrospray method, an electric field is typically formed between a target object on which a film is to be formed and a spray nozzle, and in this state, a charged film-forming solution is sprayed from the spray nozzle. Thus, droplets of the charged film-forming solution are guided to the target object by the electric field, thereby forming a film. Since the droplets that are sprayed from the spray nozzle are divided into smaller droplets due to their own electrostatic force, very small droplets can be formed as compared to spraying using a common spray, or spraying by using an IJ method.

In the case of using the electrospray method in the film-forming treatment of this manufacturing method, desired Mo films can be selected and films can be formed thereon by controlling the potential of each Mo film formed on the donor substrate 10.

FIG. 39 is a conceptual diagram of this example. In the figure, reference character "61" represents an electrospray apparatus, reference character "62" represents a capillary, reference character "63" represents a stage, and reference character "64" represents a high voltage power source. A capillary 62 contains a film-forming solution. The film-forming solution is negatively charged by a high voltage power source 64. The high voltage power source 64 has an ability to form an electric field of 1 KV per centimeter. A stage 63 is slidable in the vertical and horizontal directions. A donor substrate 10 having Mo films (the heat generating layer 16) formed thereon is placed on the upper surface of the stage 63. Each Mo film on the donor substrate 10 can be electrically connected to the high voltage power source 64 via a terminal. The amount of voltage that is applied to each Mo film and the application time of the voltage can be controlled by a control apparatus.

A general-purpose product produced by extending and processing a glass tube having an inner diameter of about 1 mm can be used as the capillary 62. The reason for this is that the droplets that are sprayed are electrically charged, and thus are divided into smaller droplets, and therefore the capillary 62 need not have such a fine nozzle hole as in the IJ method. Thus, the electrospray method is advantageous in that clogging with a coating solution is less likely to occur.

In this example, the transfer layers 11 for the light emitting layer were patterned by using the second donor substrate 10. The distance between the tip end of the capillary 62 and the donor substrate 10 on the stage 63 was adjusted to 5 cm. The film-forming solution was positively charged by applying a voltage of +5 KV thereto. On the other hand, on the side of the donor substrate 10, those Mo films on which the transfer layers 11 are to be formed are connected to the ground so as to be relatively negatively charged. Those Mo films on which the transfer layers 11 are not to be formed are connected to the high voltage power source 64, and a voltage of +7 V is applied to these Mo films. Thus, these Mo films are positively charged like the film-forming solution.

This allows the film-forming solution that is sprayed from the capillary 62 to be directed only to the predetermined Mo films. Thus, by changing a stacking material and switching connection of the Mo films for each color of RGB, the transfer layers 11 were formed on predetermined Mo films. In this case, the transfer layer 11 is formed on the entire surface of each Mo film.

The transfer layers 11 having a structure in which fine particles having a nano-level particle size were continuously bonded together were formed in this example. This eliminates the need for a drying treatment, thereby facilitating patterning. The time required for transfer was able to be reduced by 30% as compared to the first example. This seems to be because the surface area of the transfer films 11 increased due to the film structure, and thus heating of the transfer films 11 was facilitated.

Tenth Example

This example is different from the first example in that a method in which wettability of the surface of the donor substrate 10 is modified to allow a film-forming solution to adhere thereto is used as a film-forming treatment.

In this example, the first donor substrate 10 was used, and $TiO_2$ gel was formed with a thickness of 100 nm on the entire surface of the first donor substrate 10. Then, those areas having no Mo film formed thereon were irradiated with an ultraviolet (UV) lamp. Thus, the areas irradiated with UV light were provided with a hydrophilic property due to a photocatalyst function of titanium oxide. Then, the first donor substrate 10 thus modified was coated with the film-forming solution by using a spin coating method or a dipping method. Thus, a film was able to be formed only on those areas having the Mo films formed thereon and thus having been subjected to no hydrophilic treatment.

Eleventh Example

This example is different from the second example in that the heat treatment in the transfer step was changed. Specifically, multiple irradiation was conducted.

Figure 40A:
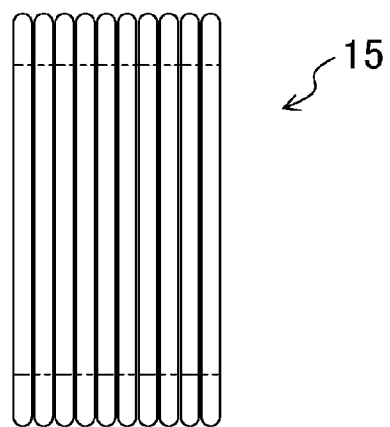
FIGS. 40A-40B are diagrams illustrating a heat source in an eleventh example, where
Figure 40B:
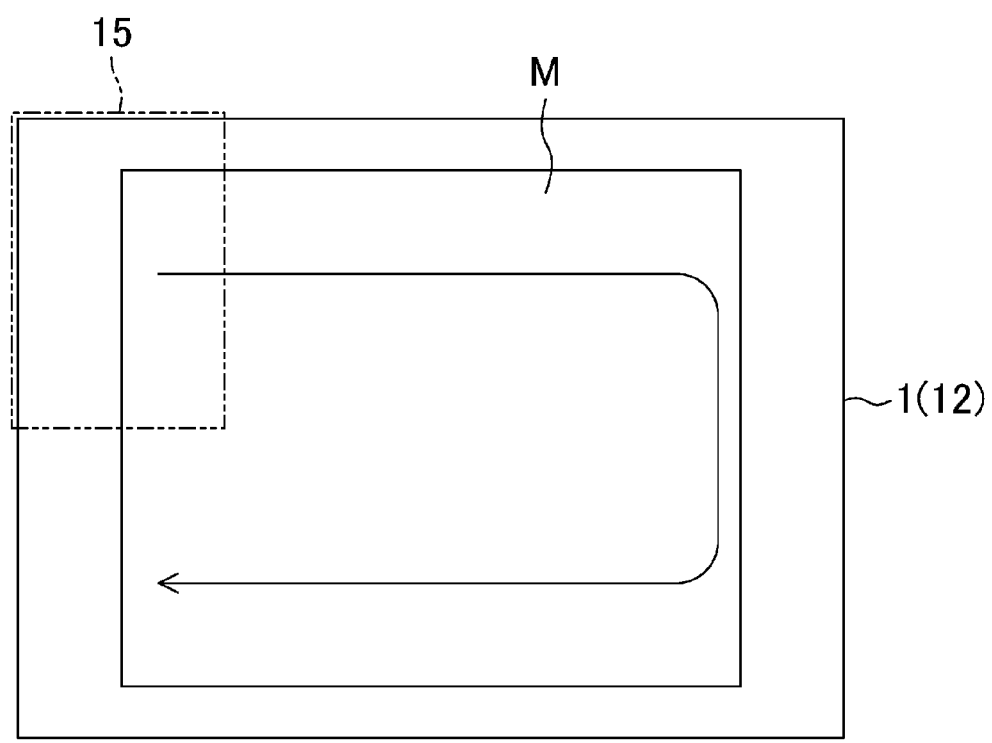

As shown in FIG. 40B, the element substrate 1 used in this example is the same as that of the second example, and has a size of 30 cm by 40 cm. An effective area M of the organic EL element on the primary surface of the element substrate 1 is 25 cm by 35 cm. The dimensions of the transfer substrate 12 are similar to those of the element substrate 1.

In the second example, twenty xenon flash lamps having a width of 1 cm and a length of 20 cm were arranged to form the heat source 15. The intensity of light radiated from the xenon flash lamps is relatively uniform in the lateral direction of the lamps, but tends to be lower in end portions in the longitudinal directions of the lamps. In particular, the difference in intensity tends to increase with time. Thus, the irradiation amount may become uneven even if the xenon flash lamps are evenly arranged.

Thus, this example was designed so as to implement uniform irradiation by radiating light while shifting the light source 15.

Specifically, as shown in FIG. 40A, ten xenon flash lamps were arranged next to each other to form the light source 15. In this case, an area of the heat source 15 capable of uniformly radiating light had a size of 15 cm by 10 cm. The heat source 15 was configured to be movable in the vacuum chamber 14 by sliding parallel to the transfer substrate 12.

With the heat source 15 thus configured, irradiation was performed four times each way while reciprocating the heat source 15 in the longitudinal direction of the transfer substrate 12, and shifting the position of the heat source 15 in the lateral direction of the transfer substrate 12 when changing the moving direction in the longitudinal direction, as shown by arrow in FIG. 40B. The entire surface of the effective area of the organic EL element was irradiated in this manner. The irradiation time per irradiation was about 100 msec, and all the irradiations were completed in about 5 seconds. The irradiated areas partially overlapped each other, but this did not cause any problem.

In this manner, different areas of the transfer substrate 12 are heated by the heat source 15, and transfer is performed a plurality of times, whereby the transfer can be uniformly and efficiently performed without significantly reducing the cycle time. Since the heat source 15 is reduced in size, the cost for members and the running cost can be reduced.

(Modification)

Figure 41A:
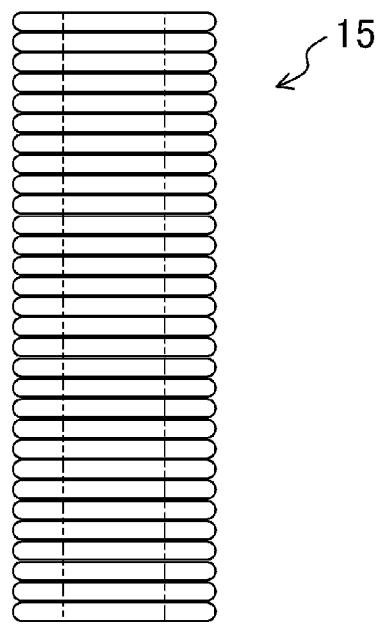
FIGS. 41A-41B are diagrams illustrating a heat source in a modification of the eleventh example, where
Figure 41B:
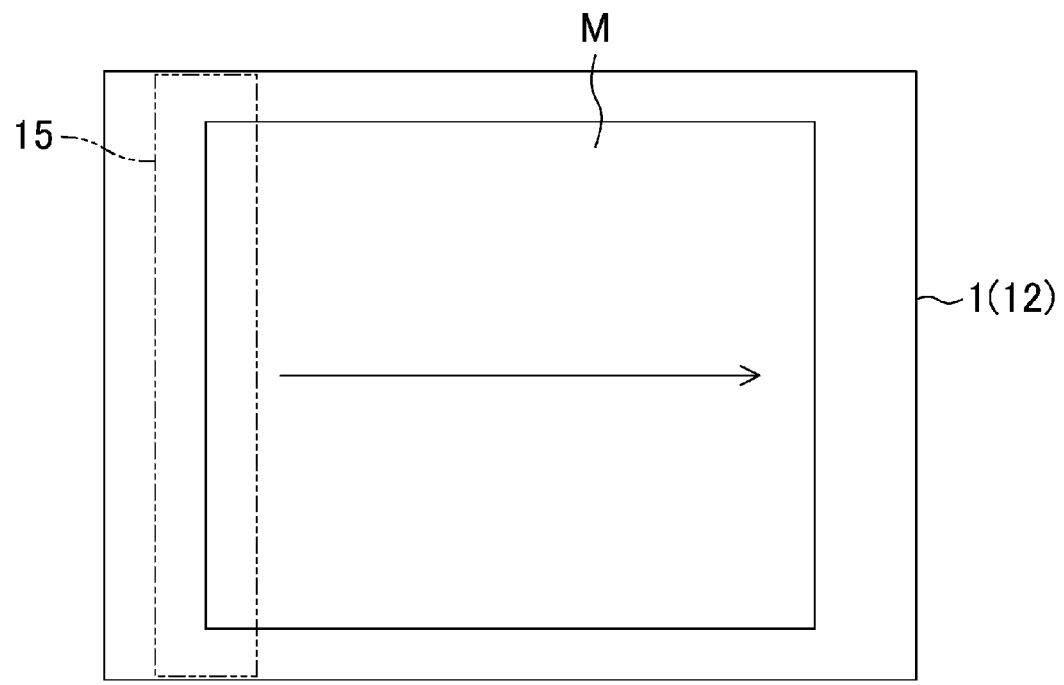

FIGS. 41A-41B show a modification of the eleventh example. In this modification, as shown in FIG. 41A, thirty xenon flash lamps having a width of 1 cm and a length of 10 cm were arranged next to each other to form the heat source 15. In this case, an area in the heat source 15 capable of uniformly radiating light had a size of 5 cm by 25 cm. The heat source 15 was configured to be movable parallel to the transfer substrate 12 along the longitudinal direction thereof in the vacuum chamber 14.

With the heat source 15 thus configured, irradiation was performed a total of six times while shifting the heat source 15 by 5 cm at a time from one longitudinal end to the other longitudinal end of the transfer substrate 12, as shown by arrow in FIG. 41B. The entire surface of the effective area of the organic EL element was irradiated with light in this manner.

Twelfth Example

This example is different from the first example in that the pressure bonding apparatus 27 shown in FIGS. 13A-13B was used in the depressurization step in order to bring the transfer substrate 12 into close contact with the element substrate 1.

In this example, the transfer substrate 12 and the element substrate 1 facing each other were placed on the platform 27c. Then, the vacuum chamber 14 was depressurized to a predetermined degree of vacuum. Thereafter, the platform 27c was lifted to bring the transfer substrate 12 into close contact with the heat source 15, and was further lifted to press the substrates 1, 12 with a load of 1 kg/cm$^2$.

This example is advantageous in that the depressurization process can be performed in a shorter time than in the first example.

Thirteenth Example

This example is different from the first example in that the film-forming solution is produced by dispersing a stacking material in a solvent.

Some stacking materials are less likely to dissolve in organic solvents, and some stacking materials are not suitable for low boiling-point solvents. Such stacking materials can also be used by dispersion in the film-forming solution.

Specifically, as a stacking material for forming the hole injection layer 41, a material insoluble in ethanol was dispersed in ethanol to produce a film-forming solution. In order to prevent formation of agglomerates, an ionic dispersion additive was added to facilitate dispersion. A surfactant may be added to form a micellar structure. In this example, in order to further improve dispersibility, dispersion was caused by using an ultrasonic homogenizer ("S-250D" made by Branson Ultrasonics Div. of Emerson Japan, Ltd.), whereby a dispersion with a small particle size was able to be obtained.

A film-forming treatment was performed in a manner similar to that of the first example by using the dispersion thus produced. A large number of agglomerates having a diameter of about several micrometers were present in the resultant transfer layers 11. However, the hole injection layer 41 subsequently transferred to the element substrate 1 had a substantially uniform structure. It seems that such a uniform structure was formed when the transfer layers 11 were transferred in the subsequent transfer step.

In the transfer step, heating in the vacuum chamber 14 evaporated the additive, and no additive was contained in the hole injection layer 41.

Fourteenth Example

This example is different from the first example in that the material of the electron transport layer 44 formed in the B sub-pixels 52*c* is different from that of the R sub-pixels 52*a* and the G sub-pixels 52*b*.

The light emitting layers 43*a*-43*c* of each sub-pixel are different from each other in bandgap, highest occupied molecular orbital (HOMO) level, and lowest unoccupied molecular orbital (LUMO) level. Thus, using the same material for the charge (hole, electron) injection layers etc. of the sub-pixels 52*a*-52*c* is not necessarily optimal for all the light emitting layers.

The LUMO level of a light emitting material that emits blue light is higher by 0.3 eV than that of a light emitting material emitting light of other colors. Thus, electrons are not successfully injected, and a light emission voltage becomes relatively high.

Thus, when forming the electron transport layer 44 in this example, the electron transport layer 44 was first formed only in the R sub-pixels 52*a* and the G sub-pixels 52*b*. Then, the electron transfer layer 44 was formed only in the B sub-pixels 52*c* by using an electron transport material different from that of the other sub-pixels 52*a*, 52*b*. The transfer layers 11 for these electron transport layers may either be separately formed by using the first donor substrate 10, or may be formed at a time by using the second donor substrate 10, as in the first example.

In the organic EL element thus formed, the optimal electron transfer layer 44 is formed in the B sub-pixels 52*c* as well. Thus, charge injection was facilitated, and the light emission voltage was able to be reduced.

Optimal different materials may be used for the electron transport layers 44 of the R sub-pixels 52*a* and the G sub-pixels 52*b*, in addition to the B sub-pixels 52*c*. Similarly, different materials may be used for the hole injection layer 41 and the hole transport layer 42, in addition to the electron transport layer 44. Moreover, a stacked structure of specific sub-pixels 52 may be changed.

INDUSTRIAL APPLICABILITY

The organic EL element of the present invention can be used in various apparatuses. For example, the organic EL element of the present invention is preferable not only for display devices for personal computers (PCs) or televisions (TVs), but also for camcorders, digital cameras, navigation systems, audio playback apparatuses (car audio systems, audio components, etc.), game machines, portable information terminals (mobile computers, mobile phones, portable game machines, electronic books, etc.). It should be understood that the present invention is also applicable to various lighting apparatuses.

DESCRIPTION OF REFERENCE CHARACTERS

1 Element Substrate
2 Anode
3 Cathode
4 Organic Layer
5 Organic Film
10 Donor Substrate
11 Transfer Layer
12 Transfer Substrate
13 Spacer
13*a* Surrounding Surface
13A Outer Peripheral Spacer
13B Dummy Spacer
14 Vacuum Chamber
15 Heat Source
16 Heat Generating Layer
17 Heating Preventing Layer
20 Pixel Electrode
21 Opening
21*a* Air Outlet
24 Hermetically Sealed Space
27 Pressure Bonding Apparatus
32 Spray
33 Mask
41 Hole Injection Layer
42 Hole Transport Layer
43 Light Emitting Layer
44 Electron Transport Layer
50 Display Portion
51 Pixel
53 Glass Substrate
54 Element Layer
55 TFT Element
61 Electrospray Apparatus
62 Capillary
63 Stage
64 High-Voltage Power Source
C Center
S Axis of Symmetry

The invention claimed is:

1. A method for manufacturing an organic EL element including an element substrate,
a pair of electrodes comprised of an anode and a cathode and provided over the element substrate, and
an organic layer formed between the electrodes and including a light emitting layer that emits light in response to application of a voltage, comprising:
a lower electrode formation step of forming a lower one of the pair of electrodes on the element substrate;
a transfer substrate fabrication step of patterning a transfer layer by patterning a heating preventing layer, configured to prevent heating, on at least one donor substrate and performing a film-forming treatment of forming a film on the donor substrate by using at least one film-forming solution including a stacking material forming the organic layer, thereby fabricating at least one transfer substrate in which the transfer layer partially covers the heating preventing layer;
an opposing arrangement step of arranging the transfer substrate and the element substrate so as to face each other with spacers interposed therebetween, such that a surface of the transfer substrate, which has the transfer layer formed thereon, faces the element substrate having the lower electrode formed thereon;
a depressurization step of holding the transfer substrate and the element substrate, which face each other, under vacuum conditions;
a transfer step of heating the transfer substrate under the vacuum conditions by a heat source to transfer the transfer layer to the element substrate;
wherein the donor substrate is comprised of a material that absorbs thermal energy emitted from the heat source.

2. The method of claim 1, wherein
the spacers are provided on the element substrate.

3. The method of claim 1, wherein
the spacers are provided on the donor substrate.

4. The method of claim 1, wherein
the stacking material is comprised of a light emitting material that forms the light emitting layer.

5. The method of claim 4, wherein
in the transfer substrate fabrication step, multiple ones of the film-forming solution are used, and
the multiple ones of the film-forming solution contain the light-emitting material having different emission wavelengths, respectively.

6. The method of claim 5, wherein
in the transfer substrate fabrication step, multiple ones of the donor substrate are used, and the transfer layer is patterned on the multiple ones of the donor substrate by using the multiple ones of the film-forming solution, respectively, thereby fabricating multiple ones of the transfer substrate, and
the transfer substrate fabrication step, the opposing arrangement step, the depressurization step, and the transfer step are repeatedly performed on each of the multiple ones of the transfer substrate.

7. The method of claim 5, wherein
in the transfer substrate fabrication step, the multiple ones of the film-forming solution are patterned on different areas of the single donor substrate, and
the opposing arrangement step, the depressurization step, and the transfer step are be performed once by using the single donor substrate.

8. The method of claim 1, wherein
the organic layer further includes a charge action layer including at least one of a charge injection layer and a charge transport layer, and
the stacking material is comprised of a charge action material that forms the charge action layer.

9. The method of claim 8, wherein
the lower electrode formation step includes a treatment of patterning an electrode material into a grid shape to form a plurality of pixel electrodes as the lower electrode, and
at least two layers comprised of the charge action material and having different thicknesses are formed on the plurality of pixel electrodes.

10. The method of claim 9, wherein
in the transfer substrate fabrication step, multiple ones of the donor substrate are used, and the transfer layer is patterned with different thicknesses on the multiple ones of the donor substrate, respectively, thereby fabricating multiple ones of the transfer substrate, and
the transfer substrate fabrication step, the opposing arrangement step, the depressurization step, and the transfer step are repeatedly performed on each of the multiple ones of the transfer substrate.

11. The method of claim 9, wherein
in the transfer substrate fabrication step, multiple ones of the transfer layer having different thicknesses are patterned on different areas of the single donor substrate, and
the opposing arrangement step, the depressurization step, and the transfer step are performed once by using the single donor substrate.

12. The method of claim 1, wherein
the spacers are arranged in a stripe pattern.

13. The method of claim 12, wherein
in the transfer substrate fabrication step, the transfer layer is patterned inside an area defined by the spacers, and has a smaller size than the area divided by the spacers, as viewed in plan.

14. The method of claim 13, wherein
the transfer layer is formed in a spot shape at at least one position in the area.

15. The method of claim 1, wherein
the lower electrode formation step includes a treatment of patterning an electrode material into a grid shape to form a plurality of pixel electrodes as the lower electrode,
the spacers are arranged so as to surround each of the plurality of pixel electrodes, and
openings are formed in surrounding surfaces of the spacers surrounding each of the pixel electrodes.

16. The method of claim 1, wherein
the lower electrode formation step includes a treatment of patterning an electrode material into a grid shape to form a plurality of pixel electrodes as the lower electrode, and
in the transfer substrate fabrication step, the transfer layer is formed so as to be located inside an area corresponding to each of the pixel electrodes, as viewed in plan.

17. The method of claim 1, wherein
in the transfer substrate fabrication step, the transfer layer is formed to have a film-like structure in which particles are continuously bonded together.

18. The method of claim 17, wherein
the film-forming treatment is performed by using a method in which the film-forming solution is divided into droplets and sprayed.

19. The method of claim 18, wherein
the film-forming treatment is performed by using an electrospray method in which an electric field is formed between a spray nozzle and the element substrate having the lower electrode formed thereon, and in this state, the film-forming solution that has been electrically charged is sprayed from the spray nozzle toward the element substrate.

20. The method of claim 18, wherein
the film-forming treatment is performed by using a mask spray method in which a mask is attached to the donor substrate, and the film-forming solution is sprayed through the mask.

21. The method of claim 1, wherein
in the transfer substrate fabrication step, a material having a boiling point of 120° C. or less is used as a solvent of the film-forming solution.

22. The method of claim 1, wherein
in the transfer substrate fabrication step, the film-forming solution is produced by dispersing the stacking material in a solvent.

23. The method of claim 22, wherein
the film-forming solution contains an additive that enhances dispersibility of the stacking material.

24. The method of claim 23, wherein
a treatment of thermally decomposing the additive is performed in the transfer substrate fabrication step.

25. The method of claim 1, wherein
the transfer substrate fabrication step is performed under atmospheric pressure conditions.

26. The method of claim 1, wherein
the transfer substrate fabrication step is performed under such conditions that a dew-point temperature is −20° C. or less.

27. The method of claim 1, wherein
in the transfer substrate fabrication step, a treatment of heating the donor substrate is performed while the transfer layer is being patterned.

28. The method of claim 1, wherein
the transfer step is performed under such conditions that a degree of vacuum is $1 \times 10^{-3}$ Pa or less.

29. The method of claim 1, wherein
in the depressurization step, a treatment of forming a hermetically sealed space between the transfer substrate and the element substrate is performed, and a pressure inside the hermetically sealed space is adjusted so as to be lower than that outside the hermetically sealed space.

30. The method of claim 1, wherein
in the depressurization step, a treatment of physically bringing the transfer substrate into contact with the element substrate is performed by a pressure bonding apparatus.

31. The method of claim 1, wherein
the transfer substrate includes a heat generating layer,
a light emitting apparatus is used as the heat source, and
the heat generating layer generates heat by absorbing light that is emitted from the light emitting apparatus.

32. The method of claim 1, wherein
a light emitting apparatus that emits infrared light is used as the heat source.

33. The method of claim 1, wherein
the heat source emits pulsed radiation of thermal energy.

34. The method of claim 1, wherein
in the transfer step, at least two different regions of the transfer substrate are heated by the heat source to perform transfer a plurality of times.

35. The method of claim 1, wherein
the film-forming treatment is performed by providing a surface of the donor substrate with liquid repellency, and then causing droplets of the film-forming solution to adhere to a predetermined area of the surface of the donor substrate.

36. The method of claim 35, wherein
the film-forming treatment is performed by using an inkjet method.

37. The method of claim 1, wherein
the film-forming treatment is performed by performing a treatment of increasing a lyophilic property of a predetermined area of the donor substrate relative to a remaining area thereof, and then causing the film-forming solution to adhere to the donor substrate.

38. The method of claim 1, wherein
a substrate with spacers is formed by providing the spacers on at least one of the transfer substrate and the element substrate,
a plurality of surrounding portions defined by the spacers are formed on one primary surface of the substrate with spacers,
openings are formed in the surrounding surfaces of the spacers respectively surrounding the plurality of surrounding portions,
the plurality of surrounding portions communicate with each other via the openings, and
at least one of the openings is placed at an end of the substrate with spacers so as to serve as an air outlet.

39. The method of claim 38, wherein
the spacers include an outer peripheral spacer provided in a peripheral portion of the substrate with spacers so as to surround the substrate with spacers, and
the air outlet is provided in a surrounding surface of the outer peripheral spacer.

40. The method of claim 39, wherein
the substrate with spacers is formed in a rectangular shape, and
the outer peripheral spacer is formed symmetrically with respect to at least one of imaginary axes of symmetry extending along sides of the substrate with spacers and extending through a center of the primary surface.

41. The method of claim 39, wherein
the substrate with spacers is formed in a rectangular shape, and
the outer peripheral spacer is formed asymmetrically with respect to at least one of imaginary axes of symmetry extending along sides of the substrate with spacers and extending through a center of the primary surface, and
a dummy spacer complementing line symmetry of the outer peripheral spacer is provided in a periphery of the outer peripheral spacer.

42. The method of claim 1, wherein
the lower electrode formation step includes a treatment of patterning an electrode material into a grid shape to form a plurality of pixel electrodes as the lower electrode, and
at least two layers, which are comprised of different kinds of the stacking material from each other, are formed on the plurality of pixel electrodes.

43. An organic EL element that is manufactured by the method of claim 1, comprising:
the spacers provided on the element substrate, wherein
an equal-thickness layer having substantially a same thickness both on the element substrate and on the spacers is included in the organic layer.

44. An organic EL display device, comprising:
the organic EL element of claim 43, wherein
an active matrix drive is used in the display device.

\* \* \* \* \*